United States Patent
Boskamp et al.

(10) Patent No.: US 11,061,089 B2
(45) Date of Patent: Jul. 13, 2021

(54) SYSTEM AND METHODS FOR GROUNDING PATIENTS DURING MAGNETIC RESONANCE IMAGING

(71) Applicant: Hyperfine Research, Inc., Guilford, CT (US)

(72) Inventors: Eddy B. Boskamp, Shelton, CT (US); Jeremy Christopher Jordan, Cromwell, CT (US)

(73) Assignee: Hyperfine Research, Inc., Guilford, CT (US)

( * ) Notice: Subject to any disclaimer, the term of this patent is extended or adjusted under 35 U.S.C. 154(b) by 1 day.

(21) Appl. No.: 16/680,992

(22) Filed: Nov. 12, 2019

(65) Prior Publication Data

US 2020/0200844 A1 Jun. 25, 2020

Related U.S. Application Data

(60) Provisional application No. 62/781,714, filed on Dec. 19, 2018.

(51) Int. Cl.
*G01R 33/34* (2006.01)
*G01R 33/421* (2006.01)
*G01R 33/48* (2006.01)

(52) U.S. Cl.
CPC ......... *G01R 33/34* (2013.01); *G01R 33/4215* (2013.01); *G01R 33/48* (2013.01)

(58) Field of Classification Search
CPC ..... G01R 33/34; G01R 33/4215; G01R 33/48
See application file for complete search history.

(56) References Cited

U.S. PATENT DOCUMENTS 5,184,074 A * 2/1993 Arakawa .............. G01R 33/283
324/309
5,986,531 A * 11/1999 Carrozzi .............. G01R 33/422
324/318

(Continued)

FOREIGN PATENT DOCUMENTS

DE 69931325 T2 4/2007
EP 0995397 A2 4/2000

(Continued)

OTHER PUBLICATIONS

International Search Report and Written Opinion for International Application No. PCT/US2019/060871 dated Jul. 1, 2020.

(Continued)

*Primary Examiner* — G. M. A Hyder
(74) *Attorney, Agent, or Firm* — Wolf, Greenfield & Sacks, P.C.

(57) ABSTRACT

A magnetic resonance imaging (MRI) system, comprising a magnetics system having a plurality of magnetics components configured to produce magnetic fields for performing magnetic resonance imaging, electromagnetic shielding provided to attenuate at least some electromagnetic noise in an operating environment of the MRI system, and an electrical conductor coupled to the electromagnetic shielding and configured to electrically couple to a patient during imaging of the patient by the MRI system. The magnetics system may include at least one permanent $B_0$ magnet configured to produce a $B_0$ magnetic field for an imaging region of the MRI system. The $B_0$ magnetic field strength may be less than or equal to approximately 0.2 T.

18 Claims, 18 Drawing Sheets

(56) References Cited

U.S. PATENT DOCUMENTS

| | | |
|---|---|---|
| 6,346,814 B1 | 2/2002 | Carozzi et al. |
| 6,377,830 B1 | 4/2002 | Carozzi et al. |
| 6,801,038 B2 | 10/2004 | Carozzi et al. |
| 7,529,575 B2 | 5/2009 | Rezzonico et al. |
| 8,970,217 B1 | 3/2015 | Kadin |
| 9,541,616 B2 | 1/2017 | Rothberg et al. |
| 9,547,057 B2 | 1/2017 | Rearick et al. |
| 9,625,543 B2 | 4/2017 | Rearick et al. |
| 9,625,544 B2 | 4/2017 | Poole et al. |
| 9,638,773 B2 | 5/2017 | Poole et al. |
| 9,645,210 B2 | 5/2017 | McNulty et al. |
| 9,797,971 B2 | 10/2017 | Rearick et al. |
| 9,817,093 B2 | 11/2017 | Rothberg et al. |
| 10,139,464 B2 | 11/2018 | Rearick et al. |
| 10,145,913 B2 | 12/2018 | Hugon et al. |
| 10,145,922 B2 | 12/2018 | Rothberg et al. |
| 10,222,434 B2 | 3/2019 | Poole et al. |
| 10,222,435 B2 | 3/2019 | Mileski et al. |
| 10,241,177 B2 | 3/2019 | Poole et al. |
| 10,274,561 B2 | 4/2019 | Poole et al. |
| 10,281,540 B2 | 5/2019 | Mileski et al. |
| 10,281,541 B2 | 5/2019 | Poole et al. |
| 10,295,628 B2 | 5/2019 | Mileski et al. |
| 10,310,037 B2 | 6/2019 | McNulty et al. |
| 10,324,147 B2 | 6/2019 | McNulty et al. |
| 10,330,755 B2 | 6/2019 | Poole et al. |
| 10,353,030 B2 | 7/2019 | Poole et al. |
| 10,371,773 B2 | 8/2019 | Poole et al. |
| 10,379,186 B2 | 8/2019 | Rothberg et al. |
| 10,416,264 B2 | 9/2019 | Sofka et al. |
| 10,444,310 B2 | 10/2019 | Poole et al. |
| 10,466,327 B2 | 11/2019 | Rothberg et al. |
| 10,488,482 B2 | 11/2019 | Rearick et al. |
| 10,495,712 B2 | 12/2019 | Rothberg et al. |
| 10,520,566 B2 | 12/2019 | Poole et al. |
| 10,527,692 B2 | 1/2020 | McNulty et al. |
| 10,534,058 B2 | 1/2020 | Sofka et al. |
| 10,539,637 B2 | 1/2020 | Poole et al. |
| 10,545,207 B2 | 1/2020 | Poole et al. |
| 10,551,452 B2 | 2/2020 | Rearick et al. |
| 10,564,239 B2 | 2/2020 | Poole et al. |
| 10,591,561 B2 | 3/2020 | Sacolick et al. |
| 10,709,387 B2 | 7/2020 | Poole et al. |
| D912,822 S | 3/2021 | Hugon |
| 2002/0057088 A1 | 5/2002 | Carrozzi et al. |
| 2005/0049491 A1 | 3/2005 | Rezzonico et al. |
| 2016/0069968 A1 | 3/2016 | Rothberg et al. |
| 2016/0069970 A1 | 3/2016 | Rearick et al. |
| 2016/0069971 A1 | 3/2016 | McNulty et al. |
| 2016/0069972 A1 | 3/2016 | Poole et al. |
| 2016/0069975 A1 | 3/2016 | Rothberg et al. |
| 2016/0128592 A1 | 5/2016 | Rosen et al. |
| 2016/0131727 A1 | 5/2016 | Sacolick et al. |
| 2016/0169992 A1 | 6/2016 | Rothberg et al. |
| 2016/0169993 A1 | 6/2016 | Rearick et al. |
| 2016/0209486 A1 | 7/2016 | Nisznansky et al. |
| 2016/0223631 A1 | 8/2016 | Poole et al. |
| 2016/0231399 A1 | 8/2016 | Rothberg et al. |
| 2016/0231402 A1 | 8/2016 | Rothberg et al. |
| 2016/0231403 A1 | 8/2016 | Rothberg et al. |
| 2016/0231404 A1 | 8/2016 | Rothberg et al. |
| 2016/0299203 A1 | 10/2016 | Mileski et al. |
| 2016/0320463 A1 | 11/2016 | O'Neill et al. |
| 2016/0334479 A1 | 11/2016 | Poole et al. |
| 2017/0102443 A1 | 4/2017 | Rearick et al. |
| 2017/0227616 A1 | 8/2017 | Poole et al. |
| 2017/0276747 A1 | 9/2017 | Hugon et al. |
| 2017/0276749 A1 | 9/2017 | Hugon et al. |
| 2018/0024208 A1 | 1/2018 | Rothberg et al. |
| 2018/0038931 A1 | 2/2018 | Rearick et al. |
| 2018/0088193 A1 | 3/2018 | Rearick et al. |
| 2018/0143274 A1 | 5/2018 | Poole et al. |
| 2018/0143275 A1 | 5/2018 | Sofka et al. |
| 2018/0143280 A1 | 5/2018 | Dyvorne et al. |
| 2018/0143281 A1 | 5/2018 | Sofka et al. |
| 2018/0144467 A1 | 5/2018 | Sofka et al. |
| 2018/0156881 A1 | 6/2018 | Poole et al. |
| 2018/0164390 A1 | 6/2018 | Poole et al. |
| 2018/0168527 A1 | 6/2018 | Poole et al. |
| 2018/0210047 A1 | 7/2018 | Poole et al. |
| 2018/0224512 A1 | 8/2018 | Poole et al. |
| 2018/0238978 A1 | 8/2018 | McNulty et al. |
| 2018/0238980 A1 | 8/2018 | Poole et al. |
| 2018/0238981 A1 | 8/2018 | Poole et al. |
| 2019/0004130 A1 | 1/2019 | Poole et al. |
| 2019/0011510 A1 | 1/2019 | Hugon et al. |
| 2019/0011513 A1 | 1/2019 | Poole et al. |
| 2019/0011514 A1 | 1/2019 | Poole et al. |
| 2019/0011521 A1 | 1/2019 | Sofka et al. |
| 2019/0018094 A1 | 1/2019 | Mileski et al. |
| 2019/0018095 A1 | 1/2019 | Mileski et al. |
| 2019/0018096 A1 | 1/2019 | Poole et al. |
| 2019/0025389 A1 | 1/2019 | McNulty et al. |
| 2019/0033402 A1 | 1/2019 | McNulty et al. |
| 2019/0033414 A1 | 1/2019 | Sofka et al. |
| 2019/0033415 A1 | 1/2019 | Sofka et al. |
| 2019/0033416 A1 | 1/2019 | Rothberg et al. |
| 2019/0038233 A1 | 2/2019 | Poole et al. |
| 2019/0086497 A1 | 3/2019 | Rearick et al. |
| 2019/0101607 A1 | 4/2019 | Rothberg et al. |
| 2019/0162806 A1 | 5/2019 | Poole et al. |
| 2019/0178962 A1 | 6/2019 | Poole et al. |
| 2019/0178963 A1 | 6/2019 | Poole et al. |
| 2019/0227136 A1 | 7/2019 | Mileski et al. |
| 2019/0227137 A1 | 7/2019 | Mileski et al. |
| 2019/0250227 A1 | 8/2019 | McNulty et al. |
| 2019/0250228 A1 | 8/2019 | McNulty et al. |
| 2019/0257903 A1 | 8/2019 | Poole et al. |
| 2019/0324098 A1 | 10/2019 | McNulty et al. |
| 2019/0353720 A1 | 11/2019 | Dyvorne et al. |
| 2019/0353723 A1 | 11/2019 | Dyvorne et al. |
| 2019/0353726 A1 | 11/2019 | Poole et al. |
| 2019/0353727 A1 | 11/2019 | Dyvorne et al. |
| 2020/0011952 A1 | 1/2020 | Rothberg et al. |
| 2020/0018806 A1 | 1/2020 | Rothberg et al. |
| 2020/0022611 A1 | 1/2020 | Nelson et al. |
| 2020/0022612 A1 | 1/2020 | McNulty et al. |
| 2020/0022613 A1 | 1/2020 | Nelson et al. |
| 2020/0025846 A1 | 1/2020 | Nelson et al. |
| 2020/0025851 A1 | 1/2020 | Rearick et al. |
| 2020/0033431 A1 | 1/2020 | Schlemper et al. |
| 2020/0034998 A1 | 1/2020 | Schlemper et al. |
| 2020/0041588 A1 | 2/2020 | O'Halloran et al. |
| 2020/0045112 A1 | 2/2020 | Sacolick et al. |
| 2020/0058106 A1 | 2/2020 | Lazarus et al. |
| 2020/0209334 A1 | 7/2020 | O'Halloran et al. |
| 2020/0289019 A1 | 9/2020 | Schlemper et al. |
| 2020/0289022 A1 | 9/2020 | Coumans et al. |
| 2020/0294229 A1 | 9/2020 | Schlemper et al. |
| 2020/0294282 A1 | 9/2020 | Schlemper et al. |
| 2020/0294287 A1 | 9/2020 | Schlemper et al. |
| 2020/0337587 A1 | 10/2020 | Sacolick et al. |
| 2020/0355765 A1 | 11/2020 | Chen et al. |
| 2021/0048498 A1 | 2/2021 | Dyvorne et al. |

FOREIGN PATENT DOCUMENTS

| | | |
|---|---|---|
| EP | 0995397 A3 | 5/2000 |
| EP | 1004269 A1 | 5/2000 |
| EP | 0995397 B1 | 5/2006 |
| EP | 1004269 B1 | 3/2011 |
| ES | 2260874 T3 | 11/2006 |
| ES | 2359543 T3 | 5/2011 |

OTHER PUBLICATIONS

Invitation to Pay Additional Fees for Application No. PCT/US2019/060871, dated Mar. 3, 2020.

Boskamp et al., Water-cooling in the space between RF body coil and RF shield. Proceedings of the International Society of Magnetic Resonance in Medicine. 2005;13:937.

(56) References Cited

OTHER PUBLICATIONS

Handa et al., Development of a local electromagnetic shielding for an extremity magnetic resonance imaging system. Review of scientific instruments. Nov. 24, 2008;79(11):113706.
Invitation to Pay Additional Fees for International Application No. PCT/US2020/054564 dated Mar. 3, 2021.

* cited by examiner

SYSTEM AND METHODS FOR GROUNDING PATIENTS DURING MAGNETIC RESONANCE IMAGING

CROSS-REFERENCE TO RELATED APPLICATIONS

This application claims the benefit of priority under 35 U.S.C. § 119 to U.S. Provisional Application Ser. No. "62/781,714", filed on Dec. 19, 2018, and titled "SYSTEM AND METHODS FOR GROUNDING PATIENTS DURING MAGNETIC RESONANCE IMAGING," which is incorporated by reference herein in its entirety.

BACKGROUND

Magnetic resonance imaging (MRI) provides an important imaging modality for numerous applications and is widely utilized in clinical and research settings to produce images of the inside of the human body. MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications allows for the investigation of internal structures and/or biological processes within the body for diagnostic, therapeutic and/or research purposes.

MRI provides an attractive imaging modality for biological imaging due to the ability to produce non-invasive images having relatively high resolution and contrast without the safety concerns of other modalities (e.g., without needing to expose the subject to ionizing radiation, e.g., x-rays, or introducing radioactive material to the body). Additionally, MRI is particularly well suited to provide soft tissue contrast, which can be exploited to image subject matter that other imaging modalities are incapable of satisfactorily imaging. Moreover, MR techniques are capable of capturing information about structures and/or biological processes that other modalities are incapable of acquiring. However, there are a number of drawbacks to MRI that, for a given imaging application, may involve the relatively high cost of the equipment, limited availability and/or difficulty in gaining access to clinical MRI scanners and/or the length of the image acquisition process.

The trend in clinical MRI has been to increase the field strength of MRI scanners to improve one or more of scan time, image resolution, and image contrast, which, in turn, continues to drive up costs. The vast majority of installed MRI scanners operate at 1.5 or 3 tesla (T), which refers to the field strength of the main magnetic field $B_0$. A rough cost estimate for a clinical MRI scanner is approximately one million dollars per tesla, which does not factor in the substantial operation, service, and maintenance costs involved in operating such MRI scanners.

Additionally, conventional high-field MRI systems typically require large superconducting magnets and associated electronics to generate a strong uniform static magnetic field ($B_0$) in which an object (e.g., a patient) is imaged. The size of such systems is considerable with a typical MRI installment including multiple rooms for the magnet, electronics, thermal management system, and control console areas. The size and expense of MRI systems generally limits their usage to facilities, such as hospitals and academic research centers, which have sufficient space and resources to purchase and maintain them. The high cost and substantial space requirements of high-field MRI systems results in limited availability of MRI scanners.

SUMMARY

Some aspects of the technology described herein relate to an MRI system, which may comprise a magnetics system having a plurality of magnetics components configured to produce magnetic fields for performing magnetic resonance imaging, electromagnetic shielding provided to attenuate at least some electromagnetic noise in an operating environment of the MRI system, and an electrical conductor electrically coupled to the electromagnetic shielding and configured to electrically couple to a patient during imaging of the patient by the MRI system.

In some embodiments, the magnetics system may comprise at least one permanent $B_0$ magnet configured to produce a $B_0$ magnetic field for an imaging region of the MRI system, a plurality of gradient coils configured to, when operated, generate magnetic fields to provide spatial encoding of emitted magnetic resonance signals, and at least one radio frequency coil configured to, when operated, transmit radio frequency signals to a field of view of the MRI and to receive magnetic resonance signals emitted from the field of view.

In some embodiments, a first portion of the electromagnetic shielding may be positioned between the plurality of gradient coils and an imaging region of the MRI system. In some embodiments, the first portion of the electromagnetic shielding may comprise a frequency selective mesh. In some embodiments, the frequency selective mesh may be configured to pass substantially all electromagnetic signals having a frequency between 1 KHz and 10 KHz and reflect back substantially all electromagnetic signals having a frequency at or above 2.76 MHz. In some embodiments, the frequency selective mesh may comprise a copper mesh having a density between 50 and 150 lines per inch.

In some embodiments, the electromagnetic shielding may be grounded through a power connection of the MRI system.

In some embodiments, the electrical conductor may comprise an electrically conductive sheet. In some embodiments, the MRI system may further comprise a surface for supporting the patient during imaging, wherein at least a part of the electrically conductive sheet is disposed on the surface. In some embodiments, the MRI system may further comprise an electrically insulative layer disposed on at least a part of the electrically conductive sheet.

In some embodiments, the electrical conductor may comprise an electrically conductive pad. In some embodiments, the electromagnetic shielding may comprise a first portion positioned between the plurality of gradient coils and the electrically conductive pad, wherein the electrically conductive pad is electrically coupled to the first portion. In some embodiments, the MRI system may further comprise an insulative layer between the electromagnetic shielding and the electrically conductive pad. In some embodiments, the electrically conductive pad may comprise an electrically conductive layer disposed within one or more insulative layers. In some embodiments, an outer surface of the electrically conductive pad may comprise an electrically conductive layer.

In some embodiments, the electrical conductor may comprise a first wire coupled to a first electrical connector configured to be attached to a patient. In some embodiments, the first electrical connector may comprise a clip. In some embodiments, the MRI system may further comprise a second wire coupled to a second electrical connector configured to be attached to the patient. In some embodiments, the electrical conductor may further comprise a second electrical connector configured to be removably attached to a complementary socket. In some embodiments, the second electrical connector may comprise a banana plug.

In some embodiments, the MRI system may further comprise a surge protection circuit electrically coupled between the electromagnetic shielding and the electrical conductor. In some embodiments, the surge protection circuit may comprise a high pass filter having a cutoff frequency above 60 Hz. In some embodiments, the high pass filter may comprise a parallel resistor-capacitor (RC) circuit and at least one backup capacitor. In some embodiments, the RC circuit may have an impedance magnitude of greater than 1 MΩ at 60 Hz, and an impedance magnitude of less than 100Ω at 2.76 MHz. In some embodiments, the surge protection circuit may be enclosed within a housing. In some embodiments, the housing may be electrically coupled to the electromagnetic shielding.

In some embodiments, the $B_0$ magnetic field may have a field strength of less than or equal to approximately 0.2 T. In some embodiments, the $B_0$ magnetic field may have a field strength of less than or equal to approximately 0.2 T and greater than or equal to approximately 0.1 T. In some embodiments, the $B_0$ magnetic field may have a field strength of less than or equal to approximately 0.1 T and greater than or equal to approximately 50 mT. In some embodiments, the at least one $B_0$ magnet may contribute to the $B_0$ magnetic field for the MRI system, the $B_0$ magnetic field having a field strength of less than or equal to approximately 50 mT and greater than or equal to approximately 20 mT.

Some aspects of the technology described herein relate to a method of operating an MRI system. The MRI system may comprise a magnetics system having a plurality of magnetics components configured to produce magnetic fields for performing MRI and an electrical conductor. The method may comprise coupling a patient to electromagnetic shielding of the MRI system using the electrical conductor, and imaging the patient using the MRI system.

In some embodiments, coupling the patient to the electromagnetic shielding using the electrical conductor may comprise coupling the patient to a surge protection circuit coupled between the electrical conductor and the electromagnetic shielding.

In some embodiments, the electrical conductor may comprise an electrically conductive sheet. Coupling the patient to the electromagnetic shielding using the electrical conductor may comprise coupling the patient to the electromagnetic shielding through the electrically conductive sheet. In some embodiments, coupling the patient to the electromagnetic shielding using the electrically conductive sheet may comprise positioning the patient to be in physical contact with the electrically conductive sheet. In some embodiments, coupling the patient to the electromagnetic shielding using the electrically conductive sheet may comprise positioning the patient within a capacitive coupling range of the electrically conductive sheet.

In some embodiments, the electrical conductor may comprise an electrically conductive pad. Coupling the patient to the electromagnetic shielding using the electrical conductor may comprise coupling the patient to the electromagnetic shielding through the electrically conductive pad. In some embodiments, the electrically conductive pad may comprise an electrically conductive layer on an outer surface. Coupling the patient to the electromagnetic shielding using the electrically conductive pad may comprise positioning the patient to be in physical contact with the electrically conductive layer. In some embodiments, the electrically conductive pad may comprise an electrically conductive layer embedded within one or more electrically insulative layers. Coupling the patient to the electromagnetic shielding using the electrically conductive pad may comprise positioning the patient within a capacitive coupling range of the electrically conductive layer.

In some embodiments, coupling the patient to the electromagnetic shielding using the electrical conductor may comprise adhering a first end of the electrical conductor to the patient, and connecting a second end of the electrical conductor to the electromagnetic shielding.

In some embodiments, imaging the patient using the MRI system may comprise generating a magnetic resonance image of the patient's anatomy at least in part by generating magnetic fields in accordance with a pulse sequence, and detecting, using at least one radio frequency coil, magnetic resonance signals emitted from the portion of the patient's anatomy.

Some aspects of the technology described herein relate to an MRI system. The MRI system may comprise a magnetics system having a plurality of magnetics components configured to produce magnetic fields for performing magnetic resonance imaging and a grounded electrical conductor configured to ground a patient during imaging of the patient by the MR imaging system.

In some embodiments, the magnetics system may comprise at least one permanent $B_0$ magnet to produce a magnetic field to contribute to the $B_0$ magnetic field for the MR imaging system, a plurality of gradient coils configured to, when operated, generate magnetic fields to provide spatial encoding of emitted magnetic resonance signals, and at least one radio frequency coil configured to, when operated, transmit radio frequency signals to a field of view of the MR imaging system and to receive magnetic resonance signals emitted from the field of view. In some embodiments, the $B_0$ magnetic field has a field strength of less than or equal to approximately 0.2 T.

In some embodiments, the MRI system may further comprise electromagnetic shielding, wherein the electromagnetic shielding is grounded, and wherein the grounded electrical conductor is grounded through the electromagnetic shielding. In some embodiments, a first portion of the electromagnetic shielding may be positioned between the plurality of gradient coils and an imaging region of the magnetic resonance imaging system. In some embodiments, the first portion of the electromagnetic shielding may comprise a frequency selective mesh. In some embodiments, the frequency selective mesh may be configured to pass substantially all electromagnetic signals having a frequency between 1 KHz and 10 KHz and reflect back substantially all electromagnetic signals having a frequency at or above 2.76 MHz. In some embodiments, the frequency selective mesh may comprise a copper mesh having a density between 50 and 150 lines per inch. In some embodiments, the electromagnetic shielding may be grounded through a power connection of the MR imaging system.

In some embodiments, the grounded electrical conductor may comprise an electrically conductive sheet. In some embodiments, the MRI system may further comprise a surface for supporting the patient during imaging, at least a part of the electrically conductive sheet being disposed on the surface. In some embodiments, the MRI system may further comprise an electrically insulative layer disposed on at least a part of the electrically conductive sheet.

In some embodiments, the grounded electrical conductor may comprise an electrically conductive pad. In some embodiments, the MRI system may further comprise electromagnetic shielding between the plurality of gradient coils and the electrically conductive pad, and wherein the electrically conductive pad is grounded through the electromagnetic shielding. In some embodiments, the MRI system may further comprise an insulative layer between the electromagnetic shielding and the electrically conductive pad. In some embodiments, the electrically conductive pad may comprise an electrically conductive layer disposed within one or more electrically insulative layers. In some embodiments, an outer surface of the electrically conductive pad may comprise an electrically conductive layer.

In some embodiments, the grounded electrical conductor may comprise a first wire coupled to a first electrical connector configured to be attached to a patient. In some embodiments, the first electrical connector may comprise a clip. In some embodiments, the MRI system may further comprise a second wire coupled to a second electrical connector configured to be attached to a patient. In some embodiments, the grounded electrical conductor may further comprise a second electrical connector configured to be removably attached to a complementary socket. In some embodiments, the second electrical connector may comprise a banana plug.

In some embodiments, the MRI system may further comprise a surge protection circuit through which the grounded electrical conductor is grounded. In some embodiments, the MRI system may further comprise electromagnetic shielding. The surge protection circuit may be electrically coupled between the electromagnetic shielding and the grounded electrical conductor. The grounded electrical conductor and the surge protection circuit may each be grounded through the electromagnetic shielding. In some embodiments, the surge protection circuit may comprise a high pass filter having a cutoff frequency above 60 Hz. In some embodiments, the high pass filter may comprise a parallel resistor-capacitor (RC) circuit and at least one backup capacitor. In some embodiments, the RC circuit may have an impedance magnitude of greater than 1 M$\Omega$ at 60 Hz, and an impedance magnitude of less than 100$\Omega$ at 2.76 MHz. In some embodiments, the surge protection circuit may be enclosed within a housing. In some embodiments, the housing may comprise a cylinder terminating in a cap.

In some embodiments, the $B_0$ magnetic field may have a field strength of less than or equal to approximately 0.2 T and greater than or equal to approximately 0.1 T. In some embodiments, the $B_0$ magnetic field may have a field strength of less than or equal to approximately 0.1 T and greater than or equal to approximately 50 mT. In some embodiments, the $B_0$ magnetic field may have a field strength of less than or equal to approximately 50 mT and greater than or equal to approximately 20 mT.

Some aspects of the technology described herein relate to an MRI system. The MRI system may comprise a magnetics system having a plurality of magnetics components configured to produce magnetic fields for performing magnetic resonance imaging, electromagnetic shielding provided to attenuate at least some electromagnetic noise in an operating environment of the MR imaging system, wherein the electromagnetic shielding is grounded, and an electrical conductor electrically coupled to the electromagnetic shielding and configured to ground a patient during imaging of the patient by the MR imaging system.

In some embodiments, the magnetics system may comprise at least one permanent $B_0$ magnet configured to produce a $B_0$ magnetic field for an imaging region of the MR imaging system, a plurality of gradient coils configured to, when operated, generate magnetic fields to provide spatial encoding of emitted magnetic resonance signals, and at least one radio frequency coil configured to, when operated, transmit radio frequency signals to a field of view of the MR imaging system and to receive magnetic resonance signals emitted from the field of view. In some embodiments, the $B_0$ magnetic field may have a field strength of less than or equal to approximately 0.2 T.

In some embodiments, a first portion of the electromagnetic shielding may be positioned between the plurality of gradient coils and an imaging region of the magnetic resonance imaging system. In some embodiments, the first portion of the electromagnetic shielding may comprise a frequency selective mesh. In some embodiments, the frequency selective mesh may be configured to pass substantially all electromagnetic signals having a frequency between 1 KHz and 10 KHz and reflect back substantially all electromagnetic signals having a frequency at or above 2.76 MHz. In some embodiments, the frequency selective mesh may comprise a copper mesh having a density between 50 and 150 lines per inch. In some embodiments, the electromagnetic shielding may be grounded through a power connection of the MR imaging system.

In some embodiments, the electrical conductor may comprise an electrically conductive sheet. In some embodiments, the MRI system may further comprise a surface for supporting the patient during imaging, at least a part of the electrically conductive sheet being disposed on the surface. In some embodiments, the MRI system may further comprise an electrically insulative layer disposed on at least a part of the electrically conductive sheet.

In some embodiments, the electrical conductor may comprise an electrically conductive pad. In some embodiments, the electromagnetic shielding may comprise a first portion between the plurality of gradient coils and the electrically conductive pad. The electrically conductive pad may be grounded through the first portion. In some embodiments, the MRI system may further comprise an insulative layer between the electromagnetic shielding and the electrically conductive pad. In some embodiments, the electrically conductive pad may comprise an electrically conductive layer disposed within one or more insulative layers. In some embodiments, an outer surface of the electrically conductive pad may comprise an electrically conductive layer.

In some embodiments, the electrical conductor may comprise a first wire coupled to a first electrical connector configured to be attached to a patient. In some embodiments, the first electrical connector may comprise a clip. In some embodiments, the MRI system may further comprise a second wire coupled to a second electrical connector configured to be attached to the patient. In some embodiments, the electrical conductor may further comprise a second electrical connector configured to be removably attached to a complementary socket. In some embodiments, the second electrical connector may comprise a banana plug.

In some embodiments, the MRI system may further comprise a surge protection circuit electrically coupled between the electromagnetic shielding and the electrical conductor. The electrical conductor and the surge protection circuit may each be grounded through the electromagnetic shielding. In some embodiments, the surge protection circuit may comprise a high pass filter having a cutoff frequency above 60 Hz. In some embodiments, the high pass filter may comprise a parallel resistor-capacitor (RC) circuit and at least one backup capacitor. In some embodiments, the RC circuit may have an impedance magnitude of greater than 1 MΩ at 60 Hz, and an impedance magnitude of less than 100Ω at 2.76 MHz. In some embodiments, the surge protection circuit may be enclosed within a housing. In some embodiments, the housing may comprise a cylinder terminating in a cap. In some embodiments, the electromagnetic shielding may be electrically coupled to at least a portion of the housing.

In some embodiments, the $B_0$ magnetic field may have a field strength of less than or equal to approximately 0.2 T and greater than or equal to approximately 0.1 T. In some embodiments, the $B_0$ magnetic field may have a field strength of less than or equal to approximately 0.1 T and greater than or equal to approximately 50 mT. In some embodiments, the $B_0$ magnetic field may have a field strength of less than or equal to approximately 50 mT and greater than or equal to approximately 20 mT.

Some aspects of the technology described herein relate to method of operating an MRI system, the MRI system comprising a magnetics system having a plurality of magnetics components configured to produce magnetic fields for performing MRI and an electrical conductor. The method may comprise grounding a patient through the electrical conductor and imaging the patient using the MRI system.

In some embodiments, grounding the patient through the electrical conductor may comprise coupling the electrical conductor between the patient and electromagnetic shielding of the MRI system. In some embodiments, coupling the electrical conductor between the patient and the electromagnetic shielding may comprise coupling the patient to a surge protection circuit coupled to the electromagnetic shielding.

In some embodiments, grounding the patient through the electrical conductor may comprise coupling the patient to ground through an electrically conductive sheet. In some embodiments, coupling the patient to ground through the electrically conductive sheet may comprise positioning the patient to be in physical contact with the electrically conductive sheet.

In some embodiments, coupling the patient to ground through the electrically conductive sheet may comprise positioning the patient within a capacitive coupling range of the electrically conductive sheet.

In some embodiments, grounding the patient through the electrical conductor may comprise coupling the patient to ground through an electrically conductive pad. In some embodiments, the electrically conductive pad may comprise an electrically conductive layer on an outer surface. Coupling the patient to ground through the electrically conductive pad may comprise positioning the patient to be in physical contact with the electrically conductive layer. In some embodiments, the electrically conductive pad may comprise an electrically conductive layer embedded within one or more electrically insulative layers. Coupling the patient to ground through the electrically conductive pad may comprise positioning the patient within a capacitive coupling range of the electrically conductive layer.

In some embodiments, grounding the patient through the electrical conductor may comprise adhering a first end of the electrical conductor the patient, and connecting a second end of the electrical conductor to electromagnetic shielding of the MRI system.

In some embodiments, imaging the patient using the MRI system may comprise generating a magnetic resonance image of the patient's anatomy at least in part by generating magnetic fields in accordance with a pulse sequence and detecting, using at least one radio frequency coil, magnetic resonance signals emitted from the portion of the patient's anatomy.

It should be appreciated that all combinations of the foregoing concepts and additional concepts described in greater detail below are contemplated as being part of the inventive subject matter disclosed herein. In particular, all combinations of claimed subject matter appearing at the end of this disclosure are contemplated as being part of the inventive subject matter disclosed herein.

BRIEF DESCRIPTION OF DRAWINGS

Various aspects and embodiments of the disclosed technology will be described with reference to the following figures. It should be appreciated that the figures are not necessarily drawn to scale.

DETAILED DESCRIPTION

Figure 1A:
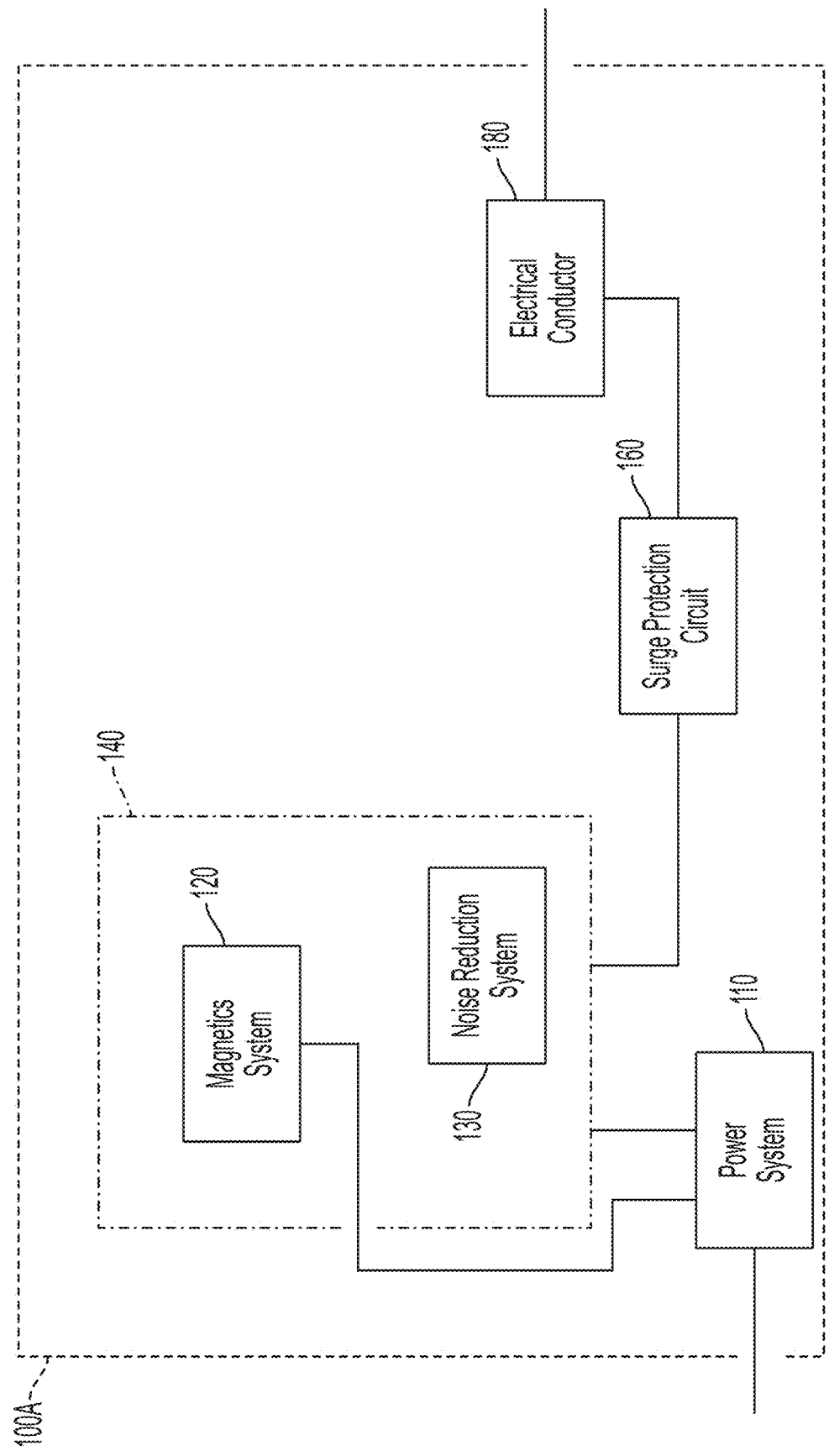
FIG. 1A is a drawing of an illustrative magnetic resonance imaging (MRI) system configured to isolate electromagnetic noise conducted by a patient, in accordance with some embodiments of the technology described herein.

The MRI scanner market is overwhelmingly dominated by high-field systems, and particularly for medical or clinical MRI applications. As described above, the general trend in medical imaging has been to produce MRI scanners with increasingly greater field strengths, with the vast majority of clinical MRI scanners operating at 1.5 Tesla (T) or 3 T, with higher field strengths of 7 T and 9 T used in research settings. As used herein, "high-field" refers generally to MRI systems presently in use in a clinical setting and, more particularly, to MRI systems operating with a main magnetic field (i.e., a $B_0$ field) at or above 1.5 T, though clinical systems operating between 0.5 T and 1.5 T are often also characterized as "high-field." Field strengths between approximately 0.2 T and 0.5 T have been characterized as "mid-field" and, as field strengths in the high-field regime have continued to increase, field strengths in the range between 0.5 T and 1.0 T have also been characterized as mid-field. By contrast, "low-field" refers generally to MRI systems operating with a $B_0$ field of less than or equal to approximately 0.2 T, though systems having a $B_0$ field of between 0.2 T and approximately 0.3 T have sometimes been characterized as low-field as a consequence of increased field strengths at the high end of the high-field regime. Within the low-field regime, low-field MRI systems operating with a $B_0$ field of less than 0.1 T are referred to herein as "very low-field" and low-field MRI systems operating with a $B_0$ field of less than 10 milliTesla (mT) are referred to herein as "ultra-low field."

As described above, conventional MRI systems require specialized facilities. An electromagnetically shielded room is required for the MRI system to operate and the floor of the room must be structurally reinforced. Additional rooms must be provided for the high-power electronics and the scan technician's control area. Secure access to the site must also be provided. In addition, a dedicated three-phase electrical connection must be installed to provide the power for the electronics that, in turn, are cooled by a chilled water supply. Additional HVAC capacity typically must also be provided. These site requirements are not only costly, but significantly limit the locations where MRI systems can be deployed. Conventional clinical MRI scanners also require substantial expertise to both operate and maintain. These highly trained technicians and service engineers add large on-going operational costs to operating an MRI system. Conventional MRI, as a result, is frequently cost prohibitive and is severely limited in accessibility, preventing MRI from being a widely available diagnostic tool capable of delivering a wide range of clinical imaging solutions wherever and whenever needed. Typically, patient must visit one of a limited number of facilities at a time and place scheduled in advance, preventing MRI from being used in numerous medical applications for which it is uniquely efficacious in assisting with diagnosis, surgery, patient monitoring and the like.

As described above, high-field MRI systems require specially adapted facilities to accommodate the size, weight, power consumption and shielding requirements of these systems. For example, a 1.5 T MRI system typically weighs between 4-10 tons and a 3 T MRI system typically weighs between 8-20 tons. In addition, high-field MRI systems generally require significant amounts of heavy and expensive shielding. To accommodate this heavy equipment, rooms (which typically have a minimum size of 30-50 square meters) have to be built with reinforced flooring (e.g., concrete flooring), and must be specially shielded to prevent electromagnetic radiation from interfering with operation of the MRI system. Thus, available clinical MRI systems are immobile and require the significant expense of a large, dedicated space within a hospital or facility, and in addition to the considerable costs of preparing the space for operation, require further additional on-going costs in expertise in operating and maintaining the system. The many physical requirements of deploying conventional clinical MRI systems create a significant problem of availability, and severely restrict the clinical applications for which MRI can be utilized.

Accordingly, low-field MRI systems may be desirable for clinical use. However, there are numerous challenges to developing a clinical MRI system in the low-field regime. As used herein, the term clinical MRI system refers to an MRI system that produces clinically useful images, which refers to images having sufficient resolution and adequate acquisition times to be useful to a physician or clinician for its intended purpose given a particular imaging application. As such, the resolutions/acquisition times of clinically useful images will depend on the purpose for which the images are being obtained. Among the numerous challenges in obtaining clinically useful images in the low-field regime is the relatively low signal-to-noise ratio (SNR). Specifically, the relationship between SNR and $B_0$ field strength is approximately $B_0^{5/4}$ at field strength above 0.2 T and approximately $B_0^{3/2}$ at field strengths below 0.1 T. As such, the SNR drops substantially with decreases in field strength with even more significant drops in SNR experienced at very low field strength. This substantial drop in SNR resulting from reducing the field strength is a significant factor that has prevented development of clinical MRI systems in the very low-field regime. In particular, the challenge of the low SNR at very low field strengths has prevented the development of a clinical MRI system operating in the very low-field regime. As a result, clinical MRI systems that seek to operate at lower field strengths have conventionally achieved field strengths of approximately the 0.2 T range and above. These MRI systems are still large, heavy and costly, generally requiring fixed dedicated spaces (or shielded tents) and dedicated power sources.

The inventors have developed techniques for producing improved quality, portable and/or lower-cost low-field MRI systems that can improve the wide-scale deployability of MRI technology in a variety of environments beyond the large MRI installments at hospitals and research facilities. As such, low-field MRI presents an attractive imaging solution, providing a relatively low cost, and high availability alternative to high-field MRI. In particular, low-field MRI systems can be implemented as self-contained systems that are deployable in a wide variety of clinical settings where high-field MRI systems cannot, for example, by virtue of being transportable, cartable or otherwise generally mobile so as to be deployable where needed. As a result, such low-field MRI systems may be expected to operate in generally unshielded or partially shielded environments (e.g., outside of specially shielded rooms or encompassing cages) and handle the particular noise environment in which they are deployed.

Some aspects of the inventors' contribution derive from their recognition that performance of a flexible low-field MRI systems (e.g., a generally mobile, transportable or cartable system and/or a system that can be installed in a variety of settings such as in an emergency room, office or clinic) may be particularly vulnerable to noise, such as RF interference, to which many conventional high field MRI systems are largely immune due to being installed in specialized rooms with extensive shielding. In particular, such systems may be required to operate in unshielded or partially shielded environments, as well as in multiple environments that may have different and/or variable sources of noise to contend with. High levels of noise may cause the SNR of the system to further decline, compromising the quality of images obtained. Accordingly, aspects of the technology described herein relate to improving the performance of low-field MRI systems in environments where the presence of noise, such as RF interference, may adversely impact the performance of such systems.

The inventors have recognized that a patient's body may introduce electromagnetic noise from the surrounding environment into a low-field MRI system. For example, at an operational frequency range of a low-field MRI system, the patient's body may act like an antenna and capture electromagnetic noise present in the environment of the low-field MRI system. In turn, the patient's body may conduct the captured noise into a portion of the low-field MRI system in which it may impact operation of the low-field MRI system. For example, the patient's body may conduct the electromagnetic noise into a region (e.g., the imaging region) in which the noise will be detected by one or more RF receive coils configured to detect MR signals. The introduction of noise into the MRI system by the patient does not occur in conventional high-field MRI systems because they are operated in specially shielded environments, and their specialized shielding prevents electromagnetic noise from reaching and being conducted by the patient's body. In contrast, low-field MRI systems are operated outside of specially shielded environments. In such settings, the patient's body may be exposed to electromagnetic noise (e.g., environmental electromagnetic noise, noise generated by other devices in the environment of the low-field MRI system), which noise is absent in the specially shielded environments of conventional high-field MRI systems. This noise reduces the SNR of the low-field MRI system, which in turn adversely impacts the quality of the images obtained by the low-field MRI system.

It should be appreciated that the operational frequency range of the low-field MRI system may include frequencies at which electromagnetic noise may influence, impact, and/or degrade the ability of the MRI system to excite and detect an MR response. In general, the operational frequency range of an MRI system corresponds to a frequency range around a nominal operating frequency (i.e., the Larmor frequency) at a given $B_0$ magnetic field strength for which the receive system is configured to or capable of detecting. This frequency range is referred to herein as an operating frequency range for the MRI system. For example, for a $B_0$ magnetic field strength of 0.1 T, the nominal operating frequency may be approximately 4 MHz, and the operational frequency range of the MRI system may be 2 KHz-10 MHz.

The inventors have developed noise isolation techniques for use with low-field MRI systems to eliminate or mitigate electromagnetic noise captured and conducted by the patient's body, thus eliminating or reducing its impact on the operation of the low-field MRI systems. By isolating noise conducted by the patient's body, either by coupling the patient to electromagnetic shielding of the MRI system, grounding the patient, or by any other suitable technique, the noise is prevented from entering the imaging region and/or impacting operation of a low-field MRI system. The techniques developed by the inventors for isolating electromagnetic noise conducted by the patient during imaging by low-field MRI systems thereby improve low-field MRI technology by facilitating operation of low-field MRI systems in unshielded or partially shielded environments.

Noise isolation techniques described herein include electrically coupling a patient to electromagnetic shielding of the MRI system. For example, the electromagnetic shielding may be positioned around an imaging region of the MRI system. By electrically coupling the patient to the electromagnetic shielding (e.g., via an electrical conductor, via capacitive or inductive coupling, or in any other suitable way), electromagnetic noise captured by the patient may be drawn to the electromagnetic shielding and away from the imaging region of the MRI system, thereby isolating the noise from the imaging region. The inventors recognized that electromagnetic noise coupled to the electromagnetic shielding at an outer edge is isolated from the imaging region because of the skin effect. The skin effect is known to cause increased current density in the outer surface of a conductor and decreased current density at inner depths of the conductor, such as in a coaxial cable, where electromagnetic noise on an outer conductor of the coaxial cable is prevented from reaching the center conductor of the coaxial cable. Accordingly, electromagnetic noise coupled to the electromagnetic shielding may be substantially if not entirely prevented from reaching the imaging region. In some embodiments, the electromagnetic shielding may be grounded. However, it should be appreciated that electrically coupling a patient to the electromagnetic shielding of the MRI system isolates electromagnetic noise captured by the patient's body even if the electromagnetic shielding is not grounded. For example, even when an impedance transformer having an inductance on the order of 1 mH is coupled between the electromagnetic shielding and ground, causing the electromagnetic shielding to float above ground over a range of frequencies, a low reactance path from the patient to the electromagnetic shielding still draws electromagnetic noise from the patient over the range of frequencies for which the electromagnetic shielding is floating, and the skin effect causes the electromagnetic shielding to isolate the noise from the imaging region.

Noise isolation techniques described herein further include coupling electromagnetic noise captured by the patient's body to ground such that it bypasses the imaging region through the ground connection. For example, the electromagnetic shielding of the MRI system may be grounded (e.g., through a power connection of the MRI system or in any other suitable way), such that the electromagnetic noise is conducted to ground through the electromagnetic shielding. As another example, the patient may be grounded without electrically coupling to the electromagnetic shielding (e.g., directly to a power connection of the MRI system or through a component of the MRI system other than the electromagnetic shielding). In either case, a voltage potential between the electromagnetic noise at the patient's body and ground may draw the electromagnetic noise to ground.

The inventors not only recognized that low-field MRI systems are improved by isolating electromagnetic noise conducted by the patient during imaging, but also have overcome technical challenges as part of developing specific techniques and systems for achieving noise isolation. For example, the inventors have recognized that establishing a path for conducting electromagnetic noise away from the patient is difficult due to high impedance in certain types of electrical conductors and electromagnetic shielding at the operational frequency range of low-field MRI systems. For example, long wires and/or large electromagnetic shielding structures have a high reactance at the operational frequency range, which results in a high impedance that does not attract a substantial amount of electromagnetic noise from the patient. The techniques for isolating noise conducted by a patient developed by the inventors address this challenge by implementing a low reactance path (e.g., through specialized electromagnetic shielding), as described herein.

As another example, isolating noise conducted by a patient by electrically coupling the patient to electromagnetic shielding may endanger the patient in the event of an electrical power surge, which may cause the patient to conduct a large amount of energy to the shielding. For example, a peripheral device in the operating environment of the low-field MRI system may experience an electrical fault while coupled to the patient and a large voltage and/or current may be applied to the patient while coupled to the shielding. The techniques for isolating noise conducted by a patient developed by the inventors address this challenge by using surge protection circuitry configured to couple electromagnetic noise to the shielding while preventing large voltages and/or currents from electrocuting the patient, as described in more detail below.

The noise isolation techniques described herein may be used with any suitable low-field or high-field MRI systems deployed in virtually any facility, including portable and cartable MRI systems. While aspects of noise isolation described herein may be particularly beneficial in the low-field context where extensive shielding may be unavailable or otherwise not provided, it should be appreciated that the techniques described herein are also suitable in the high-field context and are not limited for use with any particular type of MRI system.

According to some embodiments, an MRI system may include a magnetics system which produces magnetic fields for imaging a patient. All or part of the imaging region of the MRI system may be surrounded by electromagnetic shielding formed of an electrically conductive material and configured to attenuate at least some electromagnetic noise in the environment of the MRI system.

The MRI system also may include an electrical conductor (e.g., a wire, a conductive sheet, a conductive pad, or any other suitable electrical conductor) for coupling the patient to the electromagnetic shielding during imaging. Alternatively or additionally, the electrical conductor may be grounded (e.g., indirectly through electromagnetic shielding of the MRI system, directly through a power connection of the MRI system, or in any other suitable way). Coupling the patient to the electromagnetic shielding, or grounding the patient, using the electrical conductor may reduce the impact of environmental noise on the MRI system while imaging the patient.

In some embodiments, the magnetics system may include one or more permanent magnets for producing a $B_0$ magnetic field. The magnetics system may include one or more gradient coils to provide spatial encoding of magnetic resonance signals. The magnetics system may include one or more radio-frequency (RF) coils to transmit and/or receive RF signals to and/or from the imaging region where the patient is being imaged. In some embodiments, the $B_0$ magnetic field may have a strength of less than or equal to 0.2 T. In some embodiments, the $B_0$ magnetic field may have a strength between 0.1 T and 0.2 T, between 50 mT and 0.1 T, or between 20 mT and 50 mT.

In some embodiments, a portion of the electromagnetic shielding may be positioned between the gradient coils and the imaging region. The portion may be frequency selective so as to block substantially all electromagnetic radiation generated by the RF coils from passing through the mesh, but not to block substantially any electromagnetic radiation generated by the gradient coils from passing through the mesh. For example, the portion may have a copper mesh which blocks electromagnetic radiation at or above 2.76 MHz from passing through the mesh, but does not block electromagnetic radiation between 1 KHz and 10 KHz from passing through the mesh. The copper mesh may have a mesh density of between 50 and 150 (e.g., approximately 100) lines per inch.

In some embodiments, the electrical conductor comprises an electrically conductive sheet that couples electromagnetic noise, captured from the surrounding environment by the patient, to the electromagnetic shielding. In some embodiments, the conductive sheet may be disposed underneath the patient and above a surface of the MRI system that supports the patient, such that the conductive sheet is disposed between the patient and the surface. In some embodiments, the conductive sheet may physically contact the patient while coupling noise from the patient to the electromagnetic shielding (e.g., using a wire). Additionally or alternatively, an insulative layer, such as a cushion, may be positioned between the patient and the conductive sheet such that the conductive sheet capacitively couples noise from the patient to the shielding. In some embodiments, the conductive sheet may lie above the patient and may physically contact the patient. In any case, the conductive sheet may be coupled to the shielding or grounded (e.g., indirectly through electromagnetic shielding of the MRI system or directly through the power connection of the MRI system).

In some embodiments, the electrical conductor may include an electrically conductive pad. The conductive pad may be positioned above or below the patient. The conductive pad may have a conductive layer embedded with one or more insulative layers (e.g., for capacitively coupling to the patient). Alternatively or additionally, the conductive pad may have a conductive outer surface (e.g., for physically contacting the patient). The conductive pad may be coupled to the electromagnetic shielding or grounded (e.g., indirectly through electromagnetic shielding, directly through the power connection, or in any other suitable way). For instance, the conductive pad may be coupled to a portion of the electromagnetic shielding positioned between the gradient coils and the conductive pad. In some embodiments, a wire may couple the conductive pad to the portion of the electromagnetic shielding. In some embodiments, an insulative layer may separate the conductive pad from the portion of the electromagnetic shielding.

In some embodiments, the electrical conductor may include a wire for coupling the patient to the electromagnetic shielding. One end of the wire may have an electrical connector for attaching to the patient (e.g., a clip which may be attached to an electrode adhered to the patient), and the second end of the wire may be coupled to the electromagnetic shielding (e.g., connected to the power connection of the MRI system). In some embodiments, the wire may be grounded through the electromagnetic shielding. The second end may have an electrical connector (e.g., a banana plug).

In some embodiments, the electrical conductor may be coupled to the electromagnetic shielding or grounded through a surge protection circuit. The surge protection circuit may be configured to protect the patient from being electrocuted in the event of an electrical surge. The surge protection circuit may be coupled between the electrical conductor and the electromagnetic shielding or ground (e.g., indirectly through electromagnetic shielding, directly through the power connection, or in any other suitable way). For instance, the surge protection circuit may have a high pass filter with a cutoff frequency above 60 Hz. The high pass filter may include a resistor-capacitor (RC) circuit with one or more backup capacitors. The RC circuit may produce an impedance of at least 1 MΩ at 60 Hz, while producing an impedance of less than 100Ω at 2.76 MHz. Thus, noise coupled from the patient may be passed to the electromagnetic shielding or to ground, but high voltages and currents due to electrical surges may be isolated. In some embodiments, the surge protection circuit may prevent the patient from being electrocuted when a peripheral device (e.g., a pulse oximeter, an EKG, or any other medical equipment or device in proximity to or in the same room with the MRI system) coupled to the patient experiences an electrical surge. The surge protection circuit may be enclosed within a housing, such as a cylinder terminating in a cap. In some embodiments, the housing may be removably attached to the electromagnetic shielding of the MRI system, for example through complementary electrical connectors (e.g., a banana plug and a complementary socket) on each of the housing and the shielding.

Following below are more detailed descriptions of various concepts related to, and embodiments of, isolating noise conducted by a patient during MR imaging. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

FIG. 1A is a drawing of illustrative MRI system 100A configured to isolate electromagnetic noise conducted by a patient, in accordance with some embodiments of the technology described herein. MRI system 100A includes power system 110, magnetics system 120, noise reduction system 130, electromagnetic shielding 140, surge protection circuit 160, and electrical conductor 180. MRI system 100A may be any suitable type of MRI system and, in some embodiments, may be a low-field MRI system. For example, MRI system 100A may operate with a $B_0$ magnetic field having a field strength of less than or equal to approximately 0.2 T, less than or equal to approximately 0.1 T, and/or in the range of 0.5-0.1 T.

In the illustrative embodiment of FIG. 1A, MRI system 100A is configured to isolate electromagnetic noise conducted by a patient during imaging using electrical conductor 180, which may be configured to capacitively and/or conductively couple to a patient. For example, electrical conductor 180 is electrically coupled to electromagnetic shielding 140 in the illustrative embodiment of FIG. 1A, so as to couple electromagnetic noise conducted by the patient to electromagnetic shielding 140. In some embodiments, electrical conductor 180 may be grounded. For example, electrical conductor 180 may be coupled directly to a power connection of power system 110, or indirectly through surge protection circuit 160 and electromagnetic shielding 140, which in turn may be grounded through the power connection of power system 110. Isolating electromagnetic noise captured by a patient during imaging by coupling the patient to electromagnetic shielding 140 and/or to ground prevents the noise from impacting operation of MRI system 100A.

In the illustrative embodiment of FIG. 1A, power system 110 may include one or more power components configured to provide power to operate MRI system 100A. For example, power system 110 includes one or more power supplies, one or more amplifiers, one or more transmit/receive switches, and/or one or more thermal management components. The power supply may include a power connection through which a patient may be grounded. Components of power system 110 are described herein including with reference to FIG. 1B.

In the illustrative embodiment of FIG. 1A, magnetics system 120 may include one or more magnetics components configured to provide magnetic fields for imaging a patient. For example, magnetics system 120 may include one or more magnets to produce a $B_0$ magnetic field for MRI system 100A. Magnetics system 120 may include one or more gradient coils configured to generate magnetic fields to provide spatial encoding of emitted magnetic resonance signals. Magnetics system 120 may include one or more radio frequency (RF) coils configured to transmit RF signals to a field of view of MRI system 100A, and to receive MRI signals emitted from the field of view. Magnetics system 120 may include one or more shim coils configured to improve homogeneity of the $B_0$ field. Components of magnetics system 120 are described herein including with reference to FIG. 1B.

In the illustrative embodiment of FIG. 1A, noise reduction system 130 may be configured to detect MR signals emitted from excited atoms of a patient being imaged, and to characterize noise in the environment to suppress or remove the characterized noise from the detected MR signals. Noise reduction system 130 may include a primary RF receive coil (e.g., one of the one or more RF coils of magnetics system 120), tuning circuitry, an acquisition system and/or one or more auxiliary sensors. Noise reduction system 130 may be of any suitable type including, for example, the type described herein including with reference to FIG. 11.

In the illustrative embodiment of FIG. 1A, electromagnetic shielding 140 may include one or more electrically conductive surfaces at least partially surrounding an imaging region of MRI system 100A. As used herein, the term electromagnetic shielding refers to conductive or magnetic material configured to attenuate electromagnetic noise at the operational frequency range of the MRI system and positioned or arranged to shield a space, object and/or component of interest. In the context of an MRI system, electromagnetic shielding may be used to shield the imaging region (e.g., the field of view) of the MRI system. For example, in the illustrative embodiment of FIG. 1A, electromagnetic shielding 140 is included in moveable slides that can be opened and closed and positioned in a variety of configurations. In each of the variety of configurations, electromagnetic shielding 140 may be arranged or positioned to attenuate frequencies at least within the operational frequency range of MRI system 100A for at least a portion of the imaging region. Further aspects of electromagnetic shielding for use in low-field MRI systems, such as electromagnetic shielding 140 of MRI system 100A, are described in U.S. Pat. Application No. 2018/0164390, titled "Electromagnetic Shielding For Magnetic Resonance Imaging Methods and Apparatus", which is herein incorporated by reference in its entirety.

In some embodiments, a shielding portion of electromagnetic shielding 140 may include a frequency selective mesh configured to absorb and/or reflect electromagnetic radiation generated by the one or more RF coils and to not absorb and/or to reflect electromagnetic radiation generated by the gradient coils. Electrical conductor 180 may be coupled to this portion of electromagnetic shielding 140, as described herein including with reference to FIG. 7.

In some embodiments, electromagnetic shielding 140 may be grounded through a power connection of power system 110, such that a patient may be indirectly grounded through electromagnetic shielding 140.

In the illustrative embodiment of FIG. 1A, electrical conductor 180 is configured to isolate noise conducted by a patient during imaging of the patient by MRI system 100A. In some embodiments, electrical conductor 180 may include a wire configured to conductively couple noise captured by the patient from the surrounding environment to electromagnetic shielding 140, as described herein including with reference to FIGS. 2A, 2B, and 5. In some embodiments, electrical conductor 180 may include an electrically conductive sheet configured to capacitively and/or conductively couple noise captured by the patient from the surrounding environment to electromagnetic shielding 140, as described herein including with reference to FIGS. 3A, 3B, and 6. In some embodiments, electrical conductor 180 may include an electrically conductive pad configured to capacitively and/or conductively couple noise captured by the patient from the surrounding environment to electromagnetic shielding 140, as described herein including with reference to FIGS. 4A, 4B, 4C, and 7.

As described above, the inventors have recognized that, in the event of a power surge or other electrical overvoltage event, the patient may be exposed to dangerous amounts of electrical energy. To address this concern, MRI system 100A includes surge protection circuit 160, which is designed to prevent electrocution of the patient. As shown in FIG. 1A, surge protection circuit 160 may be coupled between electrical conductor 180 and electromagnetic shielding 140. In other embodiments, surge protection circuity 160 may be coupled between electrical conductor 180 and the power connection of power system 110. Surge protection circuit 160 is described herein including with reference to FIGS. 8A, 8B, and 9.

It should be appreciated that MRI system 100A is an illustrative embodiment, and that variations on the illustrated embodiment may be implemented. For example, magnetics system 120 and noise reduction system 130 are illustrated in FIG. 1A as surrounded by electromagnetic shielding 140. However, in some embodiments, magnetics system 120 and/or noise reduction system 130 may be partially exposed through electromagnetic shielding 140. Additionally, electrical conductor 180 is illustrated in FIG. 1A as being coupled to electromagnetic shielding 140 through surge protection circuit 160. However, it should be appreciated that some embodiments do not include electromagnetic shielding 140 and/or surge protection circuit 160. For example, in some embodiments, electrical conductor 180 is grounded directly through power system 110.

Figure 1B:
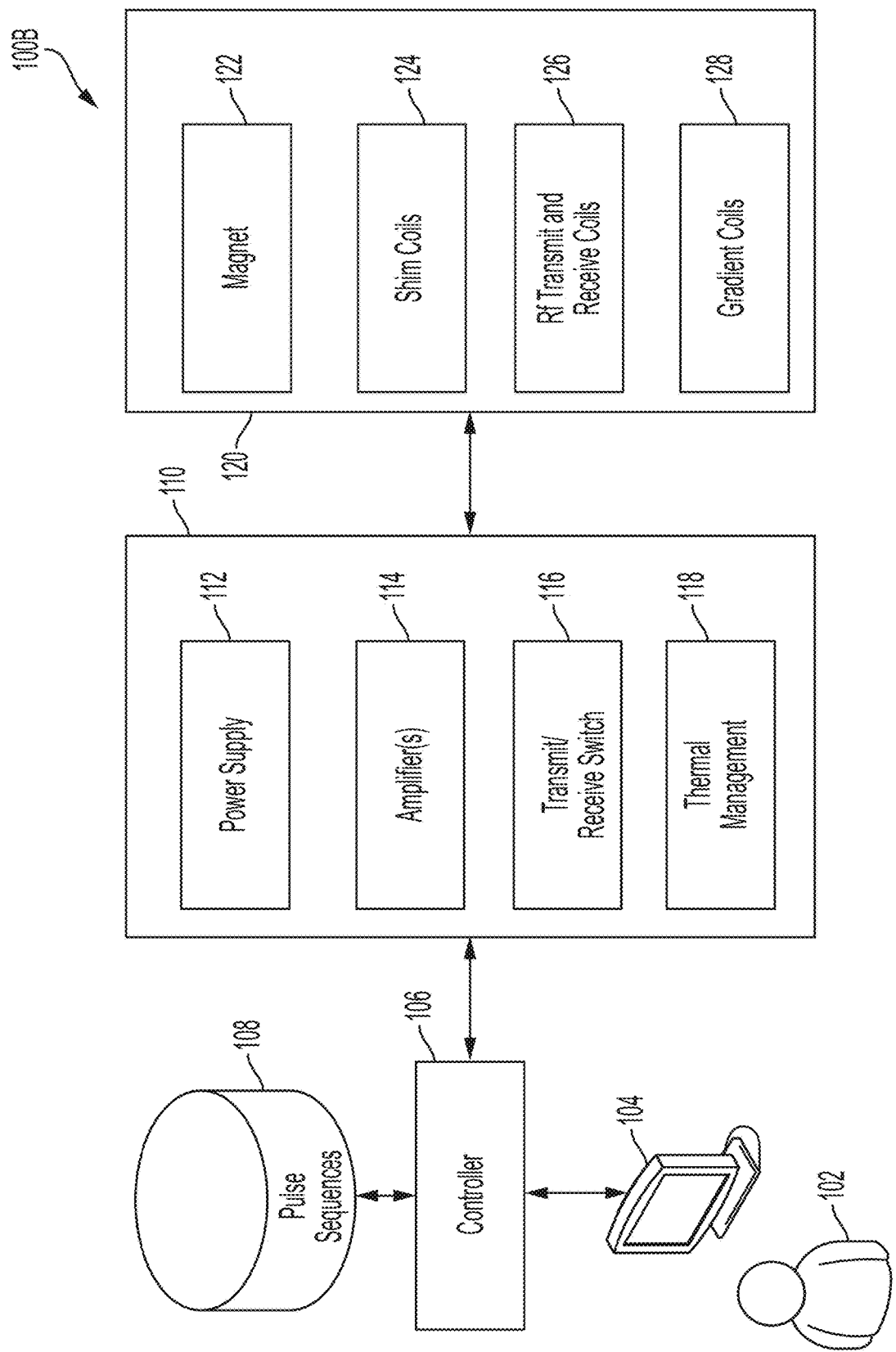
FIG. 1B is a drawing of an illustrative magnetics system, a power system and a control system for an MRI system configured to isolate electromagnetic noise conducted by a patient, in accordance with embodiments of the technology described herein.

FIG. 1B is a drawing of illustrative MRI system 100B configured to isolate electromagnetic noise conducted by a patient, in accordance with some embodiments of the technology described herein. In the illustrative embodiment of FIG. 1B, MRI system 100B includes control components, power system 110, and magnetics system 120.

As illustrated in FIG. 1B, magnetics components 120 include $B_0$ magnet 122, shim coils 124, RF transmit and receive coils 126, and gradient coils 128. The $B_0$ magnet 122 may generate the main magnetic field $B_0$. The $B_0$ magnet 122 may be any suitable type or combination of magnetics components that can generate a desired main magnetic $B_0$ field. For example, the $B_0$ magnet 122 may be a permanent magnet, an electromagnet, or a hybrid magnet comprising at least one permanent magnet and at least one electromagnet. In some embodiments, $B_0$ magnet 122 may include one or more permanent magnets formed of ferromagnetic materials. For example, $B_0$ magnet 122 may include permanent magnet rings arranged in a circular pattern (e.g., as described herein with reference to FIG. 10). In some embodiments, $B_0$ magnet 122 may include a bi-planar magnet structure positioned on opposite sides of an imaging region. In some embodiments, $B_0$ magnet 122 may include a hybrid magnet having permanent magnets and coils driven with electromagnetic signals. $B_0$ magnet 122 is described herein including with reference to FIG. 10.

In some embodiments, shim coils 124 may include one or more permanent magnet shims and/or coils driven with electromagnetic signals configured to improve the profile of the $B_0$ magnetic field produced by $B_0$ magnet 122, thereby addressing the relatively low SNR characteristic of the low-field regime. In general, a $B_0$ magnet requires some level of shimming to produce a $B_0$ magnetic field with a profile (e.g., a $B_0$ magnetic field at the desired field strength and/or homogeneity) satisfactory for use in MRI. In particular, production factors such as design, manufacturing tolerances, imprecise production processes, environment, etc., give rise to field variation that produces a $B_0$ field having unsatisfactory profile after assembly/manufacture. For example, after production, $B_0$ magnet 122 described above may produce a $B_0$ field with an unsatisfactory profile (e.g., inhomogeneity in the $B_0$ field unsuitable for imaging) that needs to be improved or otherwise corrected, typically by shimming, to produce clinically useful images.

Shimming refers to any of various techniques for adjusting, correcting and/or improving a magnetic field, often the $B_0$ magnetic field of a magnetic resonance imaging device. Similarly, a shim refers to something (e.g., an object, component, device, system or combination thereof) that performs shimming (e.g., by producing a magnetic field). Further aspects of Shim coils for use in low-field MRI systems, such as shim coils 124 of MRI system 100A, are described in U.S. Pat. Application No. 2018/0164390, titled "Electromagnetic Shielding For Magnetic Resonance Imaging Methods and Apparatus", which is herein incorporated by reference in its entirety.

In some embodiments, RF transmit and receive coils 126 are configured to transmit MR signals. MRI is performed by exciting and detecting emitted MR signals using transmit and receive coils, respectively (often referred to as radio frequency (RF) coils). Transmit/receive coils may include separate coils for transmitting and receiving, multiple coils for transmitting and/or receiving, or the same RF coil(s) for transmitting and receiving. Thus, a transmit/receive component may include one or more coils for transmitting, one or more coils for receiving, and/or one or more coils for transmitting and receiving. Transmit/receive coils are also often referred to as Tx/Rx or Tx/Rx coils to generically refer to the various configurations for the transmit and receive magnetics component of an MRI system. These terms are used interchangeably herein.

In FIG. 1B, RF transmit and receive coils 126 include one or more transmit coils that may be used to generate RF pulses to induce an oscillating magnetic field Bi. The RF transmit coil(s) may be configured to generate any suitable types of RF pulses. Further aspects of RF transmit and/or receive coils for use in low-field systems, such as RF transmit and receive coils 126 of MRI system 100A, are described in U.S. Pat. Application No. 2018/0164390, titled "Electromagnetic Shielding For Magnetic Resonance Imaging Methods and Apparatus", which is herein incorporated by reference in its entirety.

In some embodiments, gradient coils 128 may be arranged to provide gradient fields and, for example, may be arranged to generate gradients in the $B_0$ field in three substantially orthogonal directions (X, Y, Z). Gradient coils 128 may be configured to encode emitted MR signals by systematically varying the $B_0$ field (the $B_0$ field generated by magnet 122 and/or shim coils 124) to encode the spatial location of received MR signals as a function of frequency and/or phase. For example, gradient coils 128 may be configured to vary frequency and/or phase as a linear function of spatial location along a particular direction, although more complex spatial encoding profiles may also be provided by using nonlinear gradient coils. For example, a first gradient coil may be configured to selectively vary the $B_0$ field in a first (X) direction to perform frequency encoding in that direction, a second gradient coil may be configured to selectively vary the $B_0$ field in a second (Y) direction substantially orthogonal to the first direction to perform phase encoding, and a third gradient coil may be configured to selectively vary the $B_0$ field in a third (Z) direction substantially orthogonal to the first and second directions to enable slice selection for volumetric imaging applications. Further aspects of gradient coils for use in low-field systems, such as gradient coils 128 of MRI system 100A, are described in U.S. Pat. Application No. 2018/0164390, titled "Electromagnetic Shielding For Magnetic Resonance Imaging Methods and Apparatus", which is herein incorporated by reference in its entirety.

In some embodiments, power system 110 includes electronics to provide operating power to one or more components of the low-field MRI system 100B. As illustrated in FIG. 1B, power system 110 includes power supply 112, power component(s) 114, transmit/receive switch 116, and thermal management components 118 (e.g., cryogenic cooling equipment for superconducting magnets). Power supply 112 includes electronics to provide operating power to magnetic components 120 of MRI system 100B. For example, power supply 112 may include electronics to provide operating power to one or more $B_0$ coils (e.g., $B_0$ magnet 122) to produce the main magnetic field for the low-field MRI system. Transmit/receive switch 116 may be used to select whether RF transmit coils or RF receive coils are being operated.

Power component(s) 114 may include one or more RF receive (Rx) pre-amplifiers that amplify MR signals detected by one or more RF receive coils (e.g., coils 126), one or more RF transmit (Tx) power components configured to provide power to one or more RF transmit coils (e.g., coils 126), one or more gradient power components configured to provide power to one or more gradient coils (e.g., gradient coils 128), and/or one or more shim power components configured to provide power to one or more shim coils (e.g., shim coils 124).

As illustrated in FIG. 1B, control components of MRI system 100B include controller 106 having control electronics to send instructions to and receive information from power system 110. Controller 106 may be configured to implement one or more pulse sequences, which are used to determine the instructions sent to power system 110 to operate magnetic components 120 in a desired sequence. For example, in MRI system 100B, controller 106 may be configured to control power system 110 to operate the magnetic components 120 in accordance with a balance steady-state free precession (bSSFP) pulse sequence, a low-field gradient echo pulse sequence, a low-field spin echo pulse sequence, a low-field inversion recovery pulse sequence, and/or any other suitable pulse sequence. Controller 106 may be implemented as hardware, software, or any suitable combination of hardware and software, as aspects of the disclosure provided herein are not limited in this respect.

In some embodiments, controller 106 may be configured to implement a pulse sequence by obtaining information about the pulse sequence from pulse sequences repository 108, which stores information for each of one or more pulse sequences. Information stored by pulse sequences repository 108 for a particular pulse sequence may be any suitable information that allows controller 106 to implement the particular pulse sequence. For example, information stored in pulse sequences repository 108 for a pulse sequence may include one or more parameters for operating magnetics components 120 in accordance with the pulse sequence (e.g., parameters for operating the RF transmit and receive coils 126, parameters for operating gradient coils 128, etc.), one or more parameters for operating power system 110 in accordance with the pulse sequence, one or more programs including instructions that, when executed by controller 106, cause controller 106 to control MRI system 100B to operate in accordance with the pulse sequence, and/or any other suitable information. Information stored in pulse sequences repository 108 may be stored on one or more non-transitory storage media.

As illustrated in FIG. 1B, controller 106 also interacts with computing device 104 programmed to process received MR data. For example, computing device 104 may process received MR data to generate one or more MR images using any suitable image reconstruction process(es). Controller 106 may provide information about one or more pulse sequences to computing device 104 for the processing of data by the computing device. For example, controller 106 may provide information about one or more pulse sequences to computing device 104 and the computing device may perform an image reconstruction process based, at least in part, on the provided information.

In some embodiments, computing device 104 may process acquired MR data and generate one or more images of the subject being imaged. In some embodiments, computing device 104 may be a fixed electronic device such as a desktop computer, a server, a rack-mounted computer, or any other suitable fixed electronic device that may be configured to process MR data and generate one or more images of the subject being imaged. Alternatively, in some embodiments, computing device 104 may be a portable device such as a smart phone, a personal digital assistant, a laptop computer, a tablet computer, or any other portable device that may be configured to process MR data and generate one or images of the subject being imaged. In some embodiments, computing device 104 may include multiple computing devices of any suitable type, as the aspects are not limited in this respect. A user 102 may interact with workstation 104 to control aspects of MRI system 100B (e.g., program MRI system 100B to operate in accordance with a particular pulse sequence, adjust one or more parameters of MRI system 100B, etc.) and/or view images obtained by MRI system 100B.

Figure 2A:
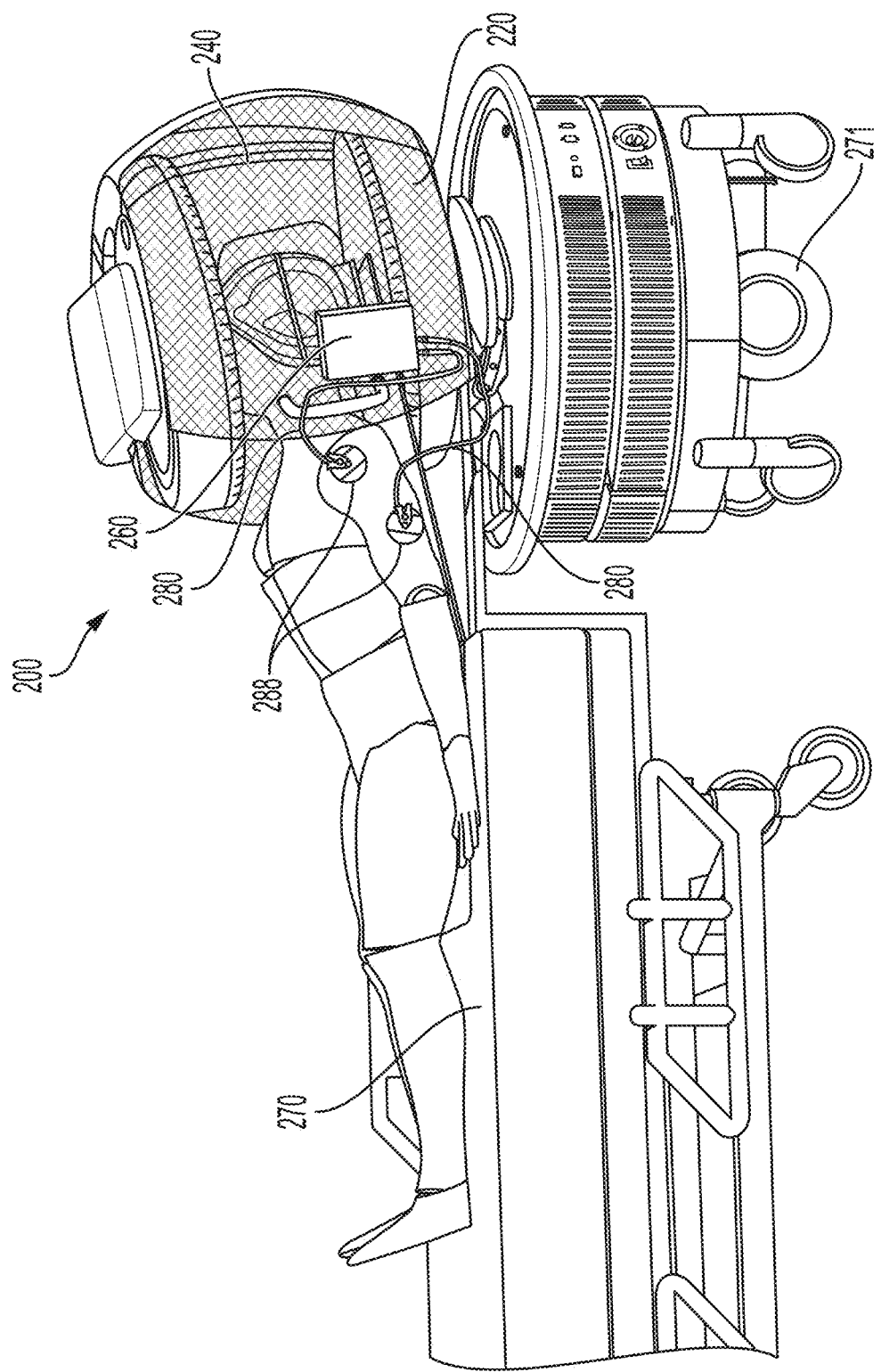
FIGS. 2A and 2B are drawings of an illustrative MRI system configured to isolate electromagnetic noise conducted by a patient, in accordance with some embodiments of the technology described herein.
Figure 2B:
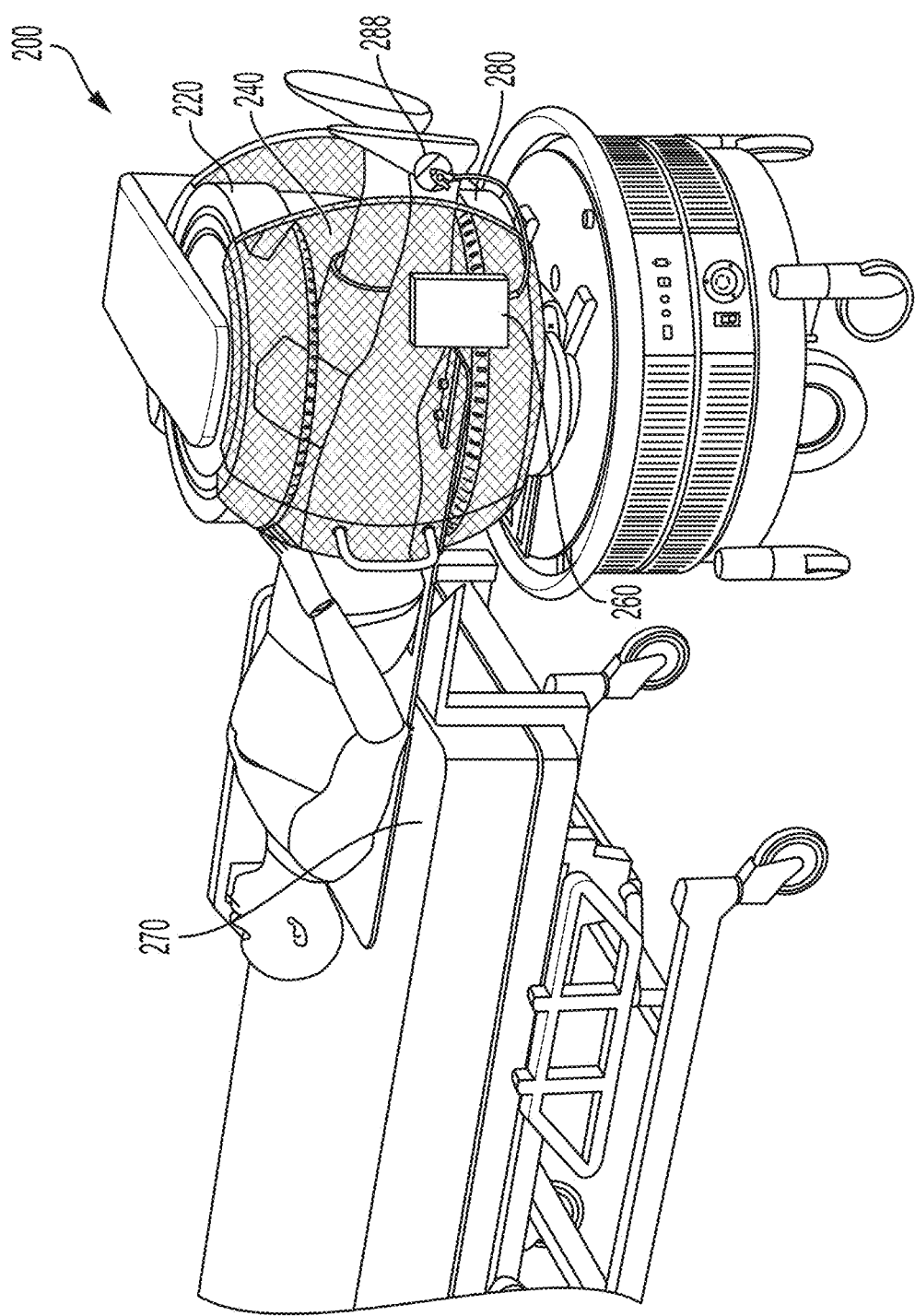

FIGS. 2A and 2B are drawings of illustrative MRI system 200 configured to isolate electromagnetic noise conducted by a patient, in accordance with some embodiments of the technology described herein. MRI system 200 includes a power system (not shown), magnetics system 220, electromagnetic shielding 240, surge protection circuit 260, and one or more electrical conductors 280. MRI system 200 is configured to couple a patient to electromagnetic shielding 240 through one or more electrical conductors 280. In the illustrated embodiments of FIGS. 2A and 2B, electrical conductor 280 includes wire(s) coupled to electrical connectors for attaching to a patient via electrodes 288 (or any other suitable devices such as conductive tape).

In the illustrative embodiment of FIG. 2A, MRI system 200 may be transported to a patient for imaging via conveyance mechanism 271. Conveyance mechanism 271 may have one or more components configured to facilitate movement of MRI system 200, for example, to a location at which MRI is needed. In some embodiments, conveyance mechanism 271 includes a motor coupled to drive wheels. Additional wheels not coupled to the motor may be provided for improved stability. Thus, conveyance mechanism 271 may provide motorized assistance in transporting MRI system 200 to desired locations. In some embodiments, motorized assistance may be controlled using a controller (e.g., a joystick or other controller that can be manipulated by a person) to guide the portable MRI system during transportation to desired locations.

In the illustrative embodiments of FIGS. 2A and 2B, the patient is supported by surface 270 of a bed during imaging. Electromagnetic shielding 240 may be included in moveable shields that can be opened or closed, for example to facilitate positioning the patient in the imaging region of MRI system 200. Components of magnetics system 220 may be positioned above and/or below the imaging region and configured to perform MR imaging of the patient. For example, a bi-planar $B_0$ magnet positioned above and below the patient may generate a $B_0$ magnetic field for the imaging region. Other components such as gradient coils, RF coils and shim coils may also be positioned above and/or below the imaging region to perform MR imaging of the patient.

In the illustrative embodiments of FIGS. 2A and 2B, electromagnetic shielding 240 is positioned around an imaging region of MRI system 200 and configured to isolate electromagnetic noise captured by the patient from the imaging region. Electromagnetic noise coupled to an outer surface of electromagnetic shielding 240 from the patient may not spread to the imaging region due to the skin effect. For example, the skin effect causes noise currents flowing on the outer surface of electromagnetic shielding 240 to have a high current density and causes noise currents flowing on the inner surface of electromagnetic shielding 240 to have substantially zero current density. Accordingly, substantially zero electric or magnetic fields are excited within the imaging region by noise currents flowing on the inner surface of electromagnetic shielding 240. Thus, an effect of electromagnetic noise coupled to electromagnetic shielding 240 on the imaging region is either reduced or eliminated, facilitating operation of MRI system 200.

In the illustrative embodiments of FIGS. 2A and 2B, the patient is coupled to electromagnetic shielding 240 by electrical conductor(s) 280 during imaging. Electrical conductor(s) 280 are attached to the patient via electrodes 288 and coupled to electromagnetic shielding 240 through surge protection circuit 260. It should be appreciated that, in other embodiments, electrical conductor(s) 280 may be grounded, either directly through power system 110 or indirectly through electromagnetic shielding 240. Surge protection circuit 260 may or may not be coupled between electrical conductor(s) 280 and electromagnetic shielding 240. Additionally, other suitable attachment devices such as conductive tape may be used in place of or in addition to electrodes 288.

FIG. 2A shows an illustrative embodiment of an MRI system 200 configured to isolate electromagnetic noise conducted by a patient during imaging of the patient's head by attaching electrical conductor(s) 280 to the patient's arm, which is positioned outside of the imaging region of MRI system 200. FIG. 2B shows an illustrative embodiment of an MRI system 200 configured to isolate electromagnetic noise conducted by a patient during imaging of the patient's leg by attaching electrical conductor(s) 280 to the patient's foot, which is positioned outside of the imaging region of MRI system 200. However, the illustrations are merely exemplary. It should be appreciated that MRI systems described herein such as MRI system 200 may be configured to isolate electromagnetic noise conducted by a patient during imaging of any or all parts of the patient. For example, electrical conductor(s) 280 may be configured to isolate electromagnetic noise conducted by the patient at a portion of the patient's body which protrudes from the imaging region of MRI system 200.

In FIG. 2A, two wires are shown isolating electromagnetic noise conducted by the patient, while in FIG. 2B, isolation is achieved using a single wire. It should be appreciated that any number of electrical conductors may be used to isolate electromagnetic noise conducted by a patient. In some embodiments, one or multiple electrical conductors 280 (e.g., wires, electrically conductive sheets, electrically conductive pads, etc.) may be configured to couple to different parts of a patient. For example, a first of electrical conductors 280 may be configured to attach to an arm of the patient, and a second of electrical conductors 280 may be configured to attach to a leg of the patient. Electrical conductors 280 including wires as shown in FIGS. 2A and 2B are described herein including with reference to FIG. 5.

Figure 3A:
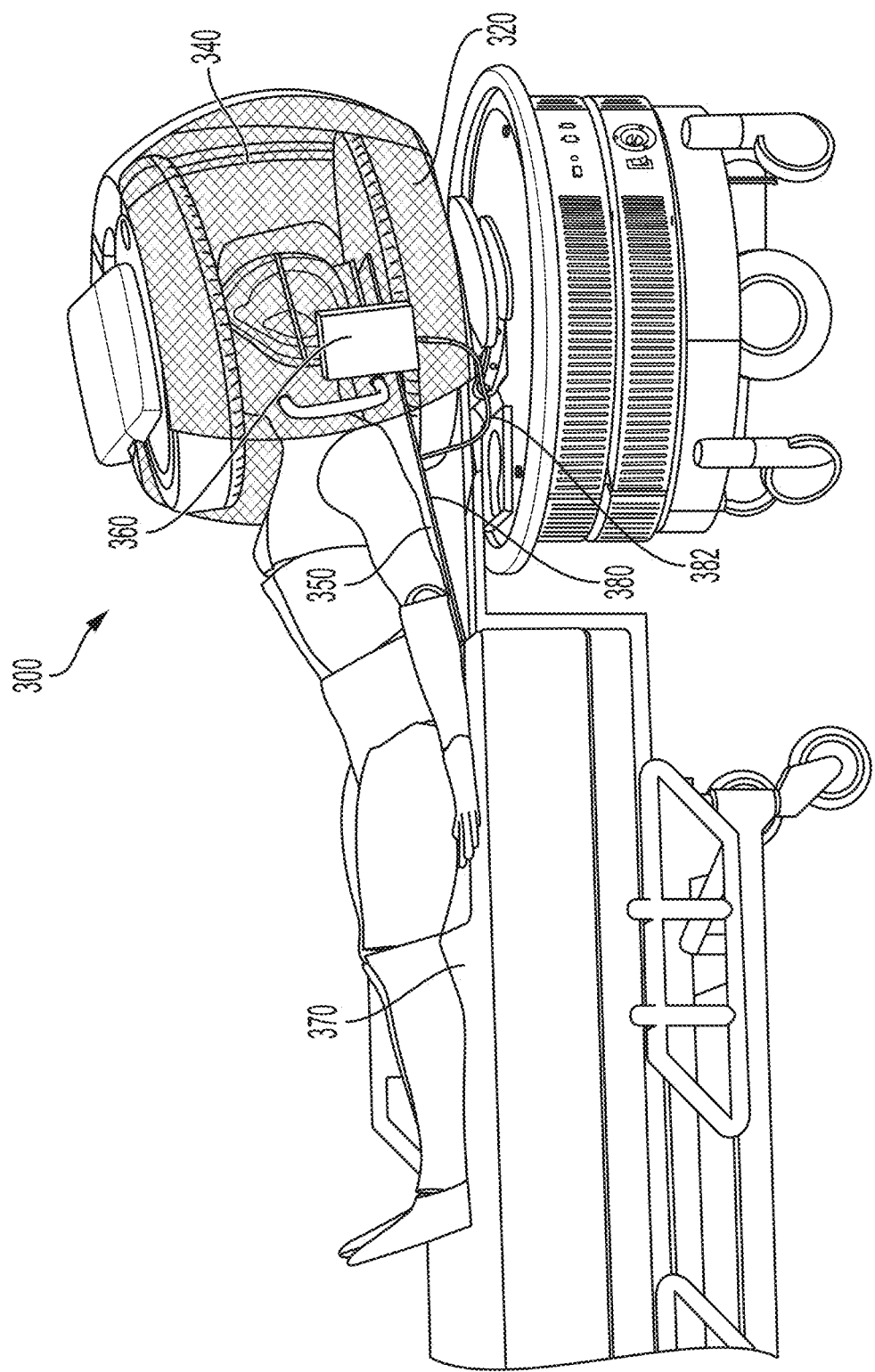
FIGS. 3A and 3B are drawings of an illustrative MRI system configured to isolate electromagnetic noise conducted by a patient, in accordance with some embodiments of the technology described herein.
Figure 3B:
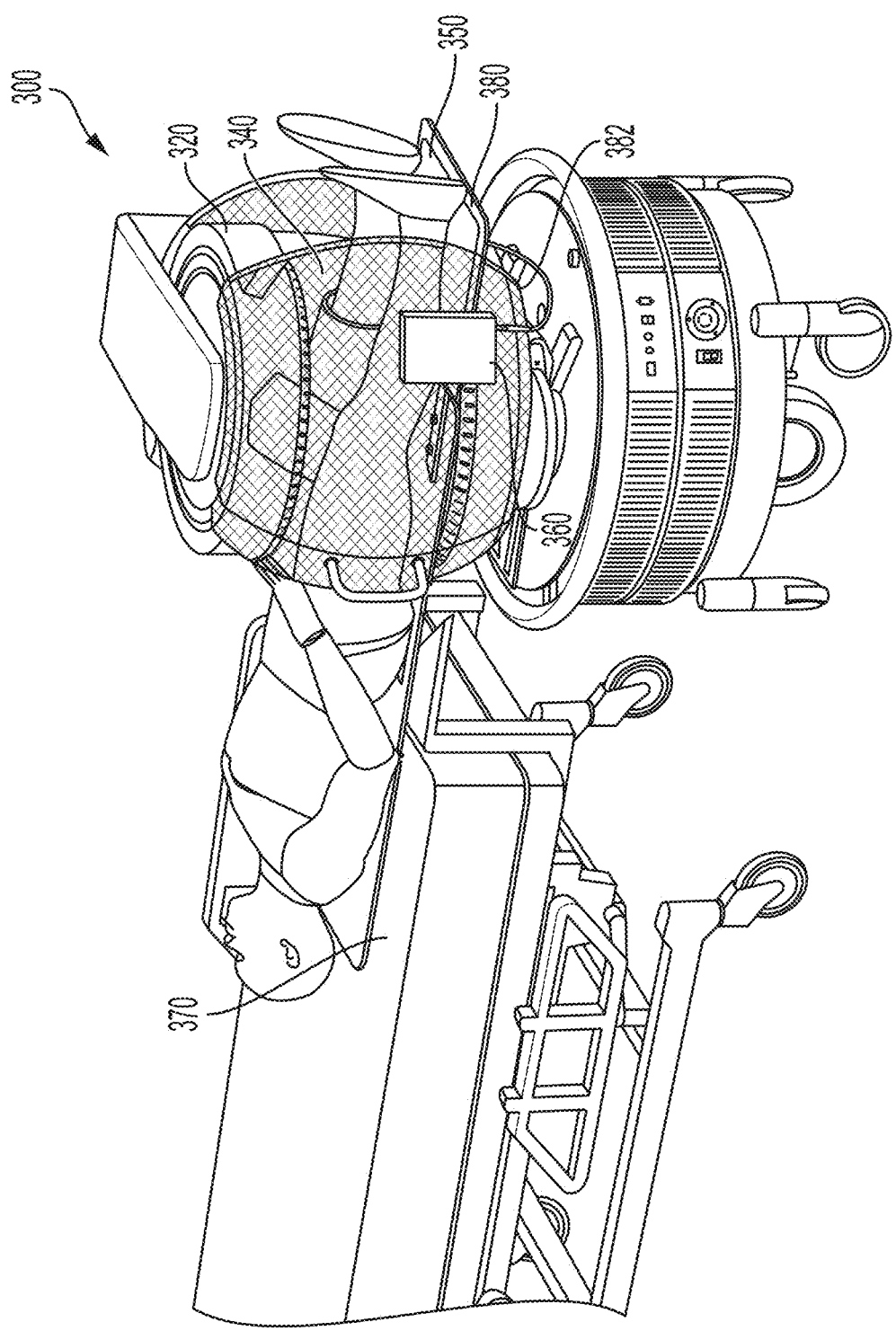

FIGS. 3A and 3B are drawings of illustrative MRI system 300 configured to isolate electromagnetic noise conducted by a patient, in accordance with some embodiments of the technology described herein. In the illustrative embodiment of FIGS. 3A and 3B, MRI system 300 includes a power system (not shown), magnetics system 320, electromagnetic shielding 340, surge protection circuit 360, and electrical conductor 380. MRI system 300 is configured to couple a patient to electromagnetic shielding 340 through electrical conductor 380. Electromagnetic shielding 340 may be configured to operate in the manner described in connection with FIGS. 2A and 2B.

In the illustrative embodiments of FIGS. 3A and 3B, electrical conductor 180 includes electrically conductive sheet 380 disposed on surface 370, with surface 370 serving as a support for the patient during imaging. Electrically insulative layer 350 is disposed on electrically conductive sheet 380, providing cushioning support for the patient. Electrically insulative layer 350 may be formed of any suitable insulative material such as foam or plastic, and may be soft or hard, with softness having the benefit of providing added comfort for the patient.

In the illustrative embodiments of FIGS. 3A and 3B, electrically conductive sheet 380 is configured to capacitively couple the patient to electromagnetic shielding 340 through electrically insulative layer 350. For example, electrically conductive sheet 380 is disposed along a length of the patient's body, such that capacitive coupling between the patient and electrically conductive sheet 380 is established at operational frequencies of MRI system 300. Wire 382 couples electrically conductive sheet 380 to electromagnetic shielding 340 indirectly through surge protection circuit 360.

In FIG. 3A, electrically conductive sheet 380 is coupled to wire 382 on a first side of MRI system 300 (e.g., at the bed), whereas in FIG. 3B electrically conductive sheet 380 is coupled to wire 382 at a second end of MRI system 300 (e.g., opposite the bed). It should be appreciated that electrically conductive sheet 380 may be coupled to wire 382 at any point along its length. In some embodiments, electrically conductive sheet 380 is coupled to electromagnetic shielding 340 through multiple paths, such as multiple wires 382. In some embodiments, more than one electrically conductive sheet 380 may be used to couple a patient to electromagnetic shielding 340. It should be appreciated that, in some embodiments, electrically conductive sheet 380 may be ground, either directly through the power system or indirectly through electromagnetic shielding 340. Surge protection circuit 360 may or may not be coupled between electrically conductive sheet 380 and electromagnetic shielding 340. For example, some embodiments do not include surge protection circuit 360. It should be appreciated that electrically conductive sheet 380 may be configured to conductively couple the patient to electromagnetic shielding 340. For example, some embodiments do not include electrically insulative layer 350, such that electrically conductive sheet 380 may physically contact the patient.

Figure 4A:
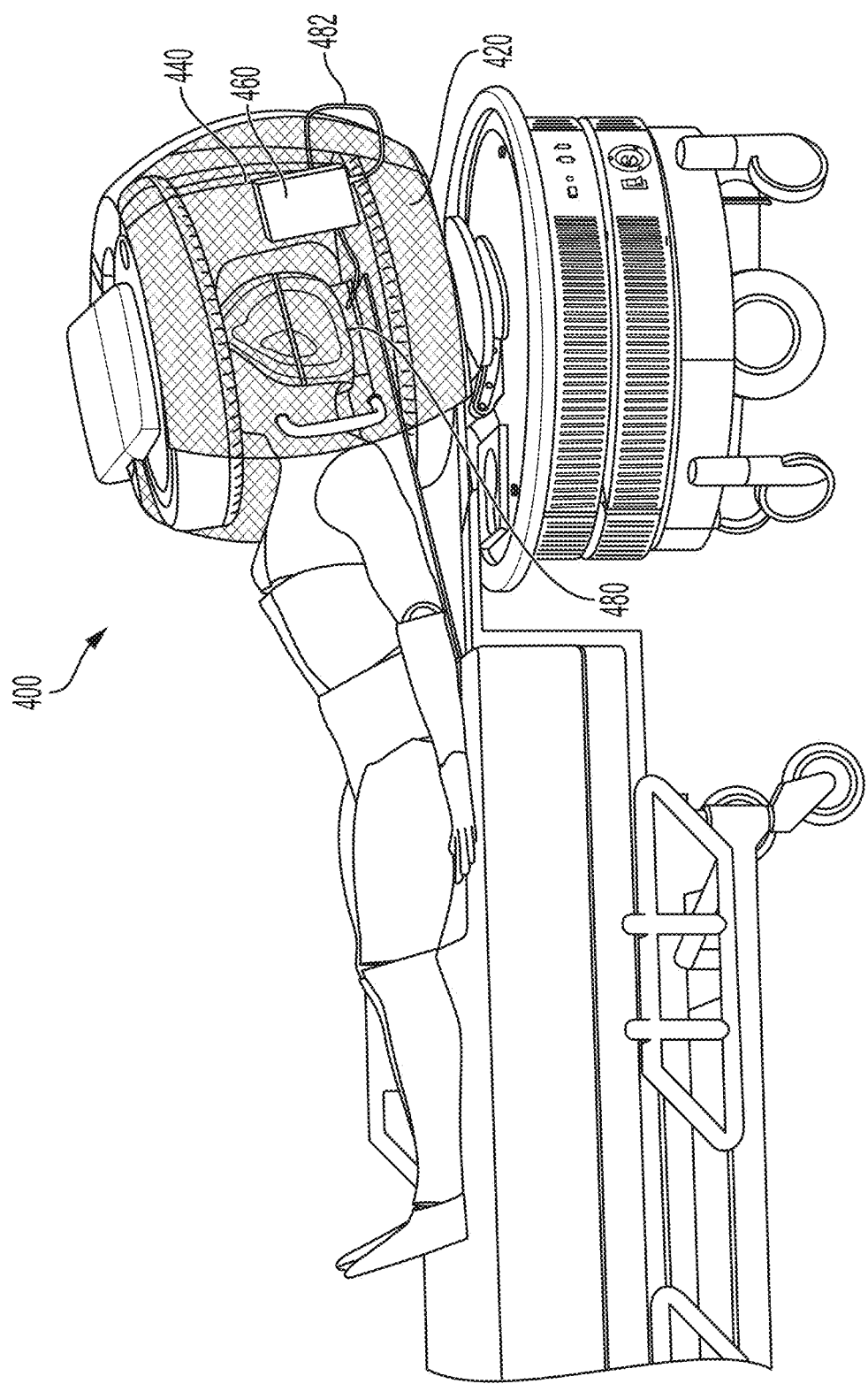
FIGS. 4A, 4B, and 4C are drawings of an illustrative MRI system configured to isolate electromagnetic noise conducted by a patient, in accordance with some embodiments of the technology described herein.
Figure 4B:
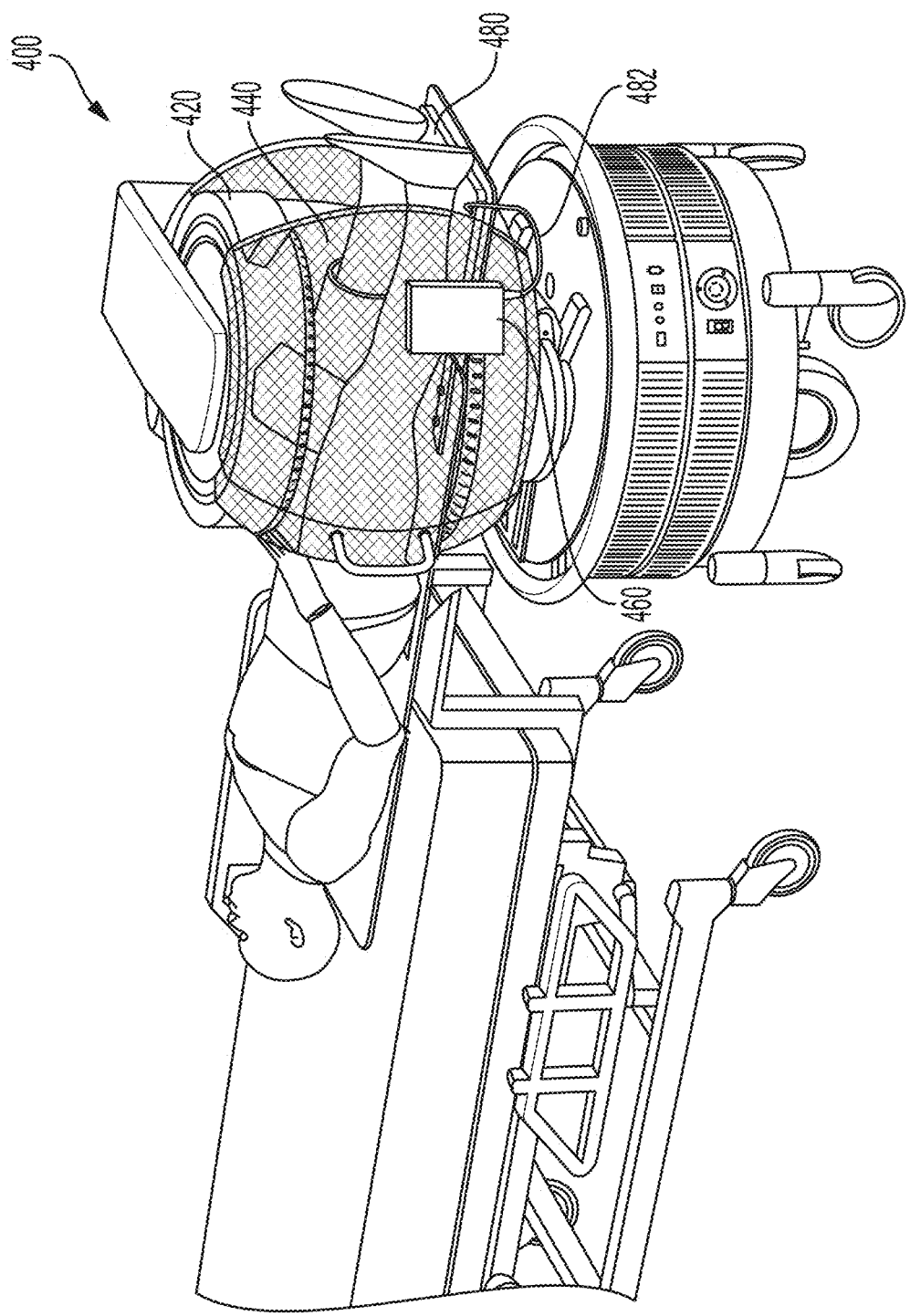
Figure 4C:
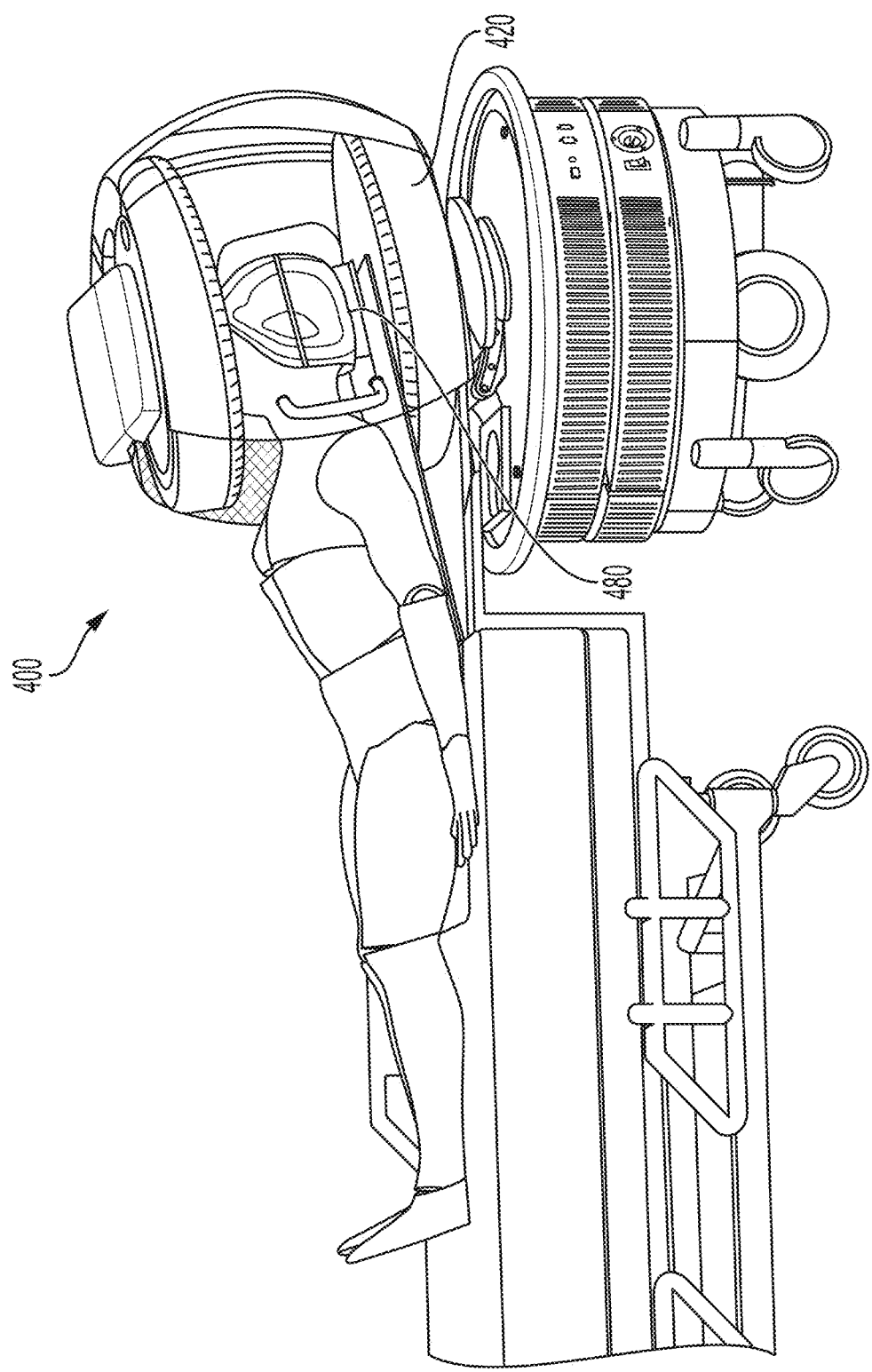

FIGS. 4A, 4B, and 4C are drawings of illustrative MRI system 400 configured to isolate electromagnetic noise conducted by a patient, in accordance with some embodiments of the technology described herein. In the illustrative embodiments of FIGS. 4A, 4B, and 4C, MRI system 400 includes a power system (not shown), magnetics system 420, electromagnetic shielding 440, surge protection circuit 460, and electrical conductor 480. MRI system 400 is configured to couple a patient to electromagnetic shielding 440 through electrical conductor 480. Electromagnetic shielding 440 may be configured to operate in the manner described in connection with FIGS. 2A and 2B. FIG. 4C shows a partially cut-away view of MRI system 400 to better illustrate electrical conductor 480.

In the illustrative embodiments of FIGS. 4A, 4B, and 4C electrical conductor 480 includes electrically conductive pad 480. In some embodiments, electrically conductive pad 480 may include one or more electrically conductive layers on an outer surface and/or embedded within one or more electrically insulative layers. It should be appreciated that electrically conductive pad 480 may include the electrically conductive layer(s) both on the outer surface and also embedded within the electrically insulative layer(s) in combination to ground the patient. Electrically conductive pad 480 may be coupled to electromagnetic shielding 440 through surge protection circuit 460, for example, by wire 482.

In some embodiments, electrically conductive pad 480 may be configured to conductively couple to the patient through the electrically conductive layer(s) on the outer surface when in physical contact with the patient. In some embodiments, electrically conductive pad 480 may be configured to capacitively couple to the patient through the electrically conductive layer(s) embedded within the electrically insulative layer(s), when placed above, below or adjacent the patient, in a manner similar to electrically conductive sheet 380. Electrically conductive pad 480 is described herein including with reference to FIG. 7.

It should be appreciated that, in some embodiments, electrically conductive pad 480 may be grounded, either directly through the power system or indirectly through electromagnetic shielding 440. Surge protection circuit 460 may or may not be coupled between electrically conductive pad 480 and electromagnetic shielding 440. For example, some embodiments do not include surge protection circuit 460.

Figure 5:
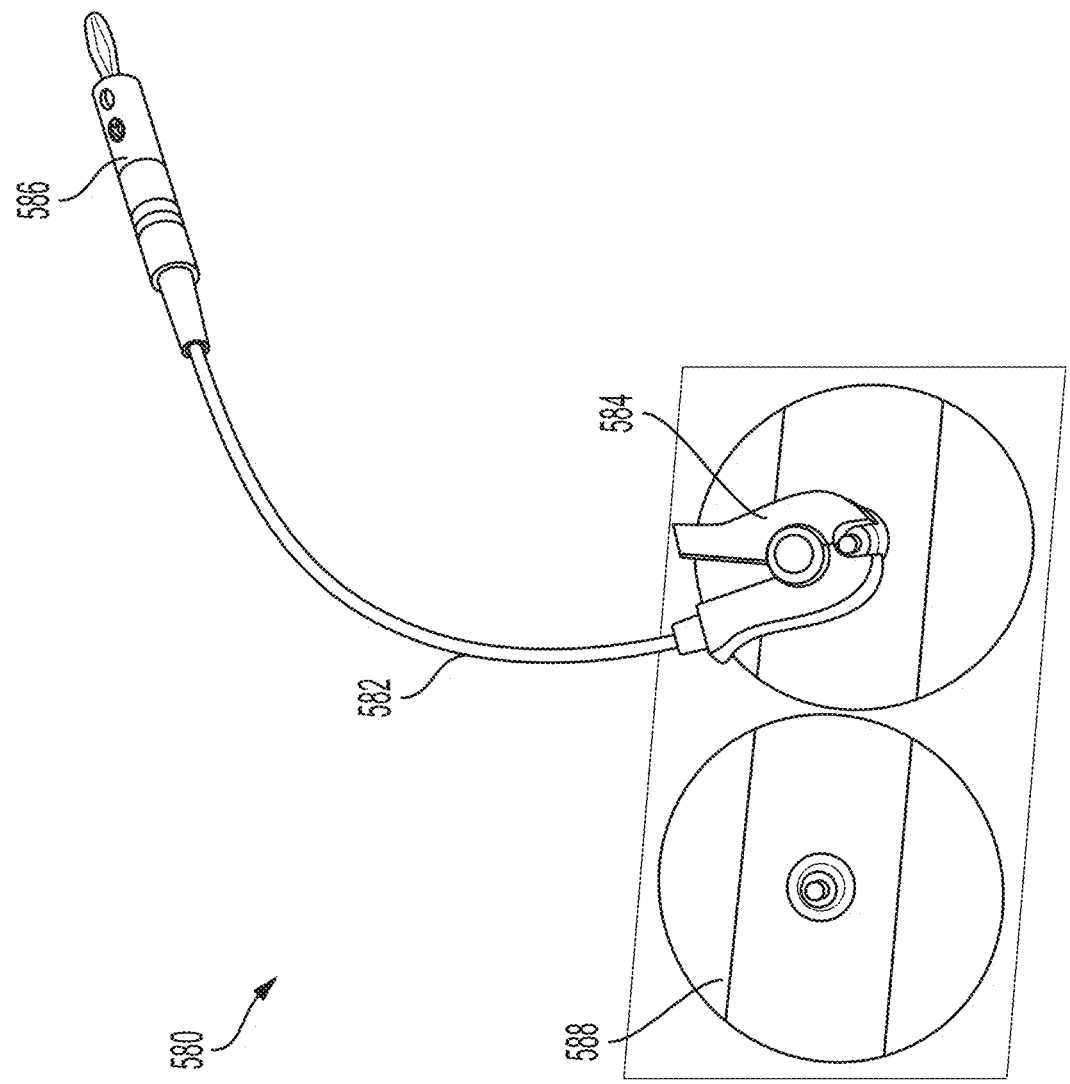
FIG. 5 is a drawing of an illustrative electrical conductor for an MRI system configured to isolate electromagnetic noise coupled by a patient, in accordance with some embodiments of the technology described herein.

FIG. 5 is a drawing of illustrative electrical conductor 580 for an MRI system configured to isolate electromagnetic noise conducted by a patient, in accordance with some embodiments of the technology described herein. In the illustrative embodiment of FIG. 5, electrical conductor 580 includes wire 582 coupled to first electrical connector 584 at a first end and second electrical connector 586 at a second end. Electrical conductor 580 is configured to conductively couple to a patient such that electromagnetic noise captured by the patient from the surrounding environment may be coupled to electromagnetic shielding 140 or to ground.

In the illustrative embodiment of FIG. 5, wire 582 includes a metal wire in an insulative wrapper. For example, wire 582 may be formed of a copper wire in a plastic jacket. However, embodiment in FIG. 5 is illustrative, and it should be appreciated that wire 582 may be any suitable wire or combination of wires including an inner conductive portion and an outer insulated portion. For example, wire 582 may include an electrical cable and/or a waveguide structure.

In the illustrated embodiment of FIG. 5, first electrical connector 584 includes clip 584 configured to be removably coupled to a patient. For example, clip 584 is shown connected to electrode 588, which is configured to adhere to a patient. However, it should be appreciated that first electrical connector 584 may include any electrical connector configured for coupling to a patient directly by physical contact, indirectly through an attachment device such as electrode 588, or in any other suitable way.

In some embodiments, electrical conductor 580 may be configured for removably coupling to electromagnetic shielding 540 via second electrical connector 586. In the illustrative embodiment of FIG. 5, for example, second electrical connector 586 includes a banana plug configured for removably coupling to a complementary banana socket. In some embodiments, second electrical connector 586 may be configured for connecting to a complimentary electrical connector of electromagnetic shielding 140. However, it should be appreciated that in some embodiments, second electrical connector 586 may be configured for connecting to a complimentary electrical connector of surge protection circuit 160, which may be coupled to electromagnetic shielding 140. In some embodiments, second electrical connector 586 may be grounded, either directly through a power connection of power system 110, for example by removably coupling to a complementary socket of power system 110, or indirectly through electromagnetic shielding 140, for example by removably coupling to a complementary socket of electromagnetic shielding 140. In some embodiments, second electrical connector 586 may be indirectly grounded through surge protection circuit 160, for example by removably coupling to a complementary socket of surge protection circuit 160.

It should be appreciated that second electrical connector 586 may include other types of electrical connectors such as clips, and may include additional conductive attachment devices such as conductive tape. The inventors have recognized that a removable connection between electrical conductor 580 and the patient may prevent damage to the MRI system in the event that electrical conductor is forcibly disconnected. For example, if electrical conductor 580 is overstressed (e.g., due to a patient moving away from the MRI system while coupled to electromagnetic shielding 140), first electrical connector 584 and/or second electrical connector 584 may be configured to disconnect from the patient or from electromagnetic shielding 140 to prevent damage to the MRI system. It should be appreciated that, in some embodiments, second electrical connector 586 may be fixedly rather than removably attached to electromagnetic shielding 140, or to power system 110 or surge protection circuit 160. For example, first electrical connector 584 may be configured for removably attaching to electrodes 588, such that damage to the MRI system may be prevented by disconnecting first electrical connector 584 while second electrical connector 586 remains connected to electromagnetic shielding 140.

Figure 6:
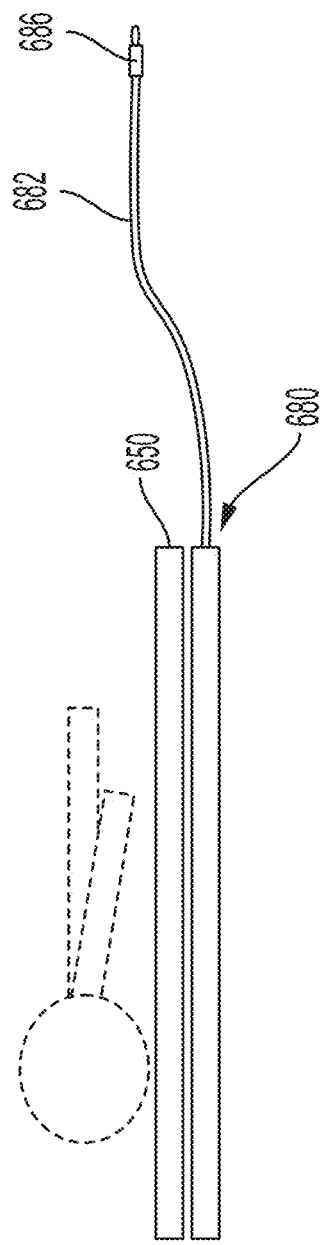
FIG. 6 is a drawing of an illustrative electrically conductive sheet for an MRI system configured to isolate electromagnetic noise conducted by a patient, in accordance with some embodiments of the technology described herein.

FIG. 6 is a drawing of illustrative electrically conductive sheet 680 for an MRI system configured to isolate electromagnetic noise conducted by a patient, in accordance with some embodiments of the technology described herein. In the illustrative embodiment of FIG. 6, electrically conductive sheet 680 is configured to capacitively couple to a patient such that electromagnetic noise captured by the patient from the surrounding environment may be coupled to electromagnetic shielding 140 or to ground. Electrically conductive sheet 680 includes wire 682 coupled to electrical connector 686.

In the illustrative embodiment, electrically conductive sheet 680 is positioned below the patient. For example, electrically conductive sheet 680 may be positioned between the patient and a surface supporting the patient from below. Electrically conductive sheet 680 may be formed of any suitable conductive material such as copper or aluminum.

In the illustrated embodiment of FIG. 6, electrically insulative layer 650 is disposed above electrically conductive sheet 680, such that electrically conductive sheet 680 is configured to capacitively couple to the patient. In some embodiments, electrically insulative layer 650 may improve capacitive coupling between electrically conductive sheet 680 and the patient. In some embodiments, electrically insulative layer 650 may provide comfortable support to the patient. In some embodiments, electrically insulative layer 650 may be formed of a cushioning dielectric material which may both improve capacitive coupling between electrically conductive sheet 680 and the patient as well as provide comfortable support for the patient. It should be appreciated that electrically conductive sheet 680 may be positioned above, below, or adjacent the patient, and electrically insulative layer 650 may be positioned between electrically conductive sheet 680 and the patient accordingly. Alternatively, in some embodiments, electrically conductive sheet 680 may be positioned between electrically insulative layer 650 and the patient. In some embodiments, more than one electrically insulative layer 650 may be disposed above, below or otherwise adjacent to electrically conductive sheet 680.

In some embodiments, electrically conductive sheet 680 may be configured for removably connecting to electromagnetic shielding 140 or to ground via wire 682 terminating in electrical connector 686. In the illustrative embodiment of FIG. 6, electrical connector 686 includes a banana plug configured for removably connecting to a complementary banana socket in the manner described in connection with FIG. 5 for second electrical connector 586. In some embodiments, electrical connector 686 may be connected to a complementary socket of electromagnetic shielding 140, and/or grounded through power system 110, or surge protection circuit 160. It should be appreciated that electrical connector 686 may include other types of electrical connectors such as clips, and may include additional conductive attachment devices such as conductive tape.

It should be appreciated that, in some embodiments, electrically conductive sheet 680 may be configured to conductively couple to the patient through physical contact. For example, some embodiments do not include electrically insulative layer 650.

Figure 7:
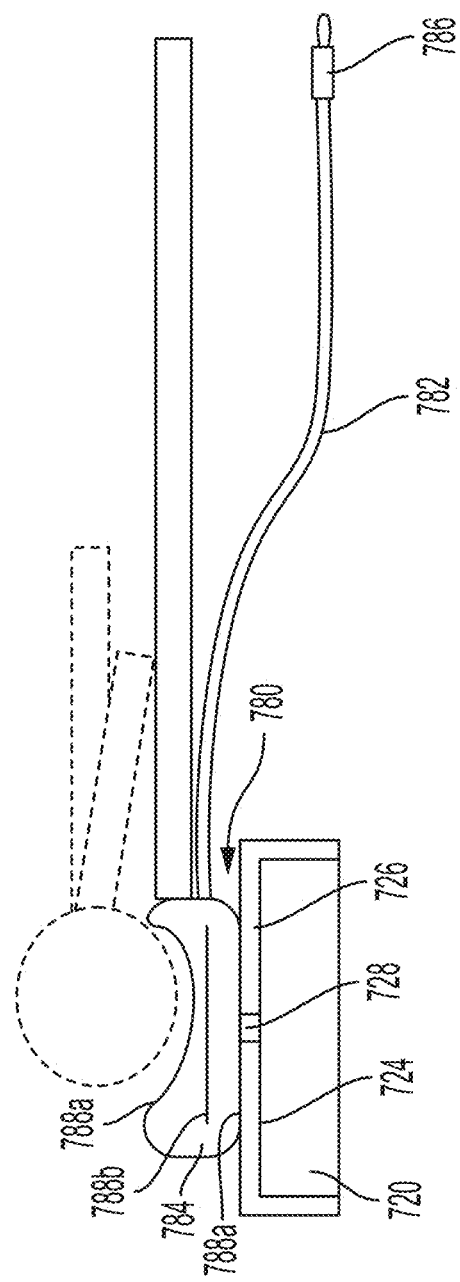
FIG. 7 is a drawing of an illustrative electrically conductive pad for an MRI system configured to isolate electromagnetic noise conducted by a patient, in accordance with some embodiments of the technology described herein.

FIG. 7 is a drawing of illustrative electrically conductive pad 780 for an MRI system configured to isolate electromagnetic noise conducted by a patient, in accordance with some embodiments of the technology described herein. In the illustrative embodiment of FIG. 7, electrically conductive pad 780 is disposed adjacent components 720 of magnetics system 120, with shielding portion 724 of electromagnetic shielding 140 disposed between electrically conductive pad 780 and components 720. Electrically insulative layer 726 is disposed between shielding portion 724 and electrically conductive pad 780. Electrically conductive pad 780 is coupled to electromagnetic shielding 724 through electrically insulative layer 726 via electrically conductive member 728.

In the illustrative embodiment of FIG. 7, electrically conductive pad 780 includes electrically conductive layers 788a and 788b for capacitively and conductively coupling to the patient. For example, electrically conductive layer 788a is disposed on an outer surface of electrically conductive pad 780 and configured for conductively coupling to a patient through physical contact. Additionally, electrically conductive layer 788b is shown disposed within one or more electrically insulative layers 784, and configured for capacitively coupling to the patient. It should be appreciated that electrically conductive pad 780 may include electrically conductive layers 788a and 788b, or may include only electrically conductive layer(s) 788a or only electrically conductive layer(s) 788b.

In the illustrative embodiment, electrically conductive pad 780 includes electrically insulative layer(s) 784. In some embodiments, electrically conductive layer(s) 788a are disposed around electrically insulative layer(s) 784. For example, electrically insulative layer(s) 784 may provide comfortable support for the patient while electrically conductive layer(s) 788a on the outer surface of electrically conductive pad 780 conductively couple to the patient. In some embodiments, electrically conductive layer(s) 788b are disposed within electrically insulative layer(s) 784. For example, electrically insulative layer(s) 784 may provide comfortable support and physically contact the patient while electrically conductive layer(s) 788b capacitively couples to the patient. However, it should be appreciated that some embodiments do not include electrically insulative layer(s) 784.

In some embodiments, electrically conductive pad 780 is configured for removably coupling to electromagnetic shielding 140 or to ground via wire 782 terminating in electrical connector 786. In the illustrative embodiment of FIG. 7, electrical connector 786 includes a banana plug configured for removably connecting to a complementary banana socket in the manner described in connection with FIGS. 5 and 6 for second electrical connector 586 and electrical connector 686. In some embodiments, electrical connector 786 may be coupled to a complementary socket of electromagnetic shielding 140, power system 110, or surge protection circuit 160. It should be appreciated that electrical connector 786 may include other types of electrical connectors such as clips, and may include additional conductive attachment devices such as conductive tape.

In some embodiments, electrically conductive pad 780 may be coupled to electromagnetic shielding 140 through electrically conductive member 728. In the illustrative embodiment of FIG. 7, electrically conductive member 728 is coupled between electrically conductive pad 780 and shielding portion 724 of electromagnetic shielding 140. Electrically conductive member 728 may be formed of any suitable conductive material such as copper or aluminum. In some embodiments, electrically conductive member 728 may include a compliant copper tab configured to extend towards the patient and to compress towards shielding portion 724 when placed below electrically conductive pad 780. In some embodiments, electrically conductive member 728 may couple electrically conductive pad 780 to shielding portion 724 through electrically insulative layer 726. Electrically insulative layer 726 may be formed of any suitable electrically insulative material such as plastic.

In some embodiments, electrically conductive pad 780 may be coupled to shielding portion 724. In the illustrative embodiment of FIG. 7, shielding portion 724 is positioned between electrically conductive pad 780 and components 720 of magnetics system 120. In some embodiments, portion 724 of electromagnetic shielding 140 may be positioned between components 720 such as $B_0$ magnet 122, shim coil(s) 124, RF transmit and/or receive coil(s) 126, and/or gradient coil(s) 128 of magnetics system 120 and the imaging region where electrically conductive pad 780 may be disposed. In some embodiments, shielding portion 724 may include a frequency selective mesh configured to block substantially all electromagnetic radiation generated by the RF coil(s) of magnetics system 120, and to not block substantially any electromagnetic radiation generated by the gradient coil(s) of components 720.

Frequency selective characteristics of electromagnetic shielding depend on a number of factors including the type of material used, the material thickness, the size and shape of apertures in the electromagnetic shielding (e.g., the size of the spaces in a conductive mesh, the size of unshielded portions or gaps in the shielding, etc.) and/or the orientation of apertures relative to an incident electromagnetic field. These characteristics may be selected such that the frequency selective mesh is configured to block substantially all electromagnetic radiation in a first frequency range and configured not to block substantially any electromagnetic radiation in a second frequency range.

In some embodiments, the RF coil(s) may be configured to generate electromagnetic radiation at or above 2.76 MHz, and the gradient coil(s) may be configured to generate electromagnetic radiation between approximately 1 KHz and approximately 10 KHz. Accordingly, in some embodiments, shielding portion 724 may include a copper mesh having a density between 50 and 150 lines per inch, between 75 and 125 lines per inch, between 85 and 115 lines per inch, between 90 and 110 lines per inch, or a density in any other suitable density range in these ranges. Thus, shielding portion 724 may be configured to absorb and/or reflect substantially all electromagnetic radiation having a frequency at or above approximately 2.76 MHz, and to not absorb and/or reflect substantially any electromagnetic radiation having a frequency between approximately 1 KHz and approximately 10 KHz.

The inventors have recognized that portion 724 of electromagnetic shielding 140 provides a low reactance path for MRI system 100A. In the illustrative embodiment of FIG. 1A, a patient may be coupled to shielding portion 724 of electromagnetic shielding 140, for example by electrically conductive pad 780 coupling directly (or indirectly through surge protection circuit 160) to shielding portion 724. In some embodiments, the patient may be coupled to shielding portion 742. In some embodiments, the patient may be alternatively or additionally grounded through shielding portion 724. For example, shielding portion 724 may be coupled to a power connection of power system 110. In some embodiments, electrically conductive pad 780 may be coupled to shielding portion 724 through each of wire 782 and electrical connector 786.

Figure 8A:
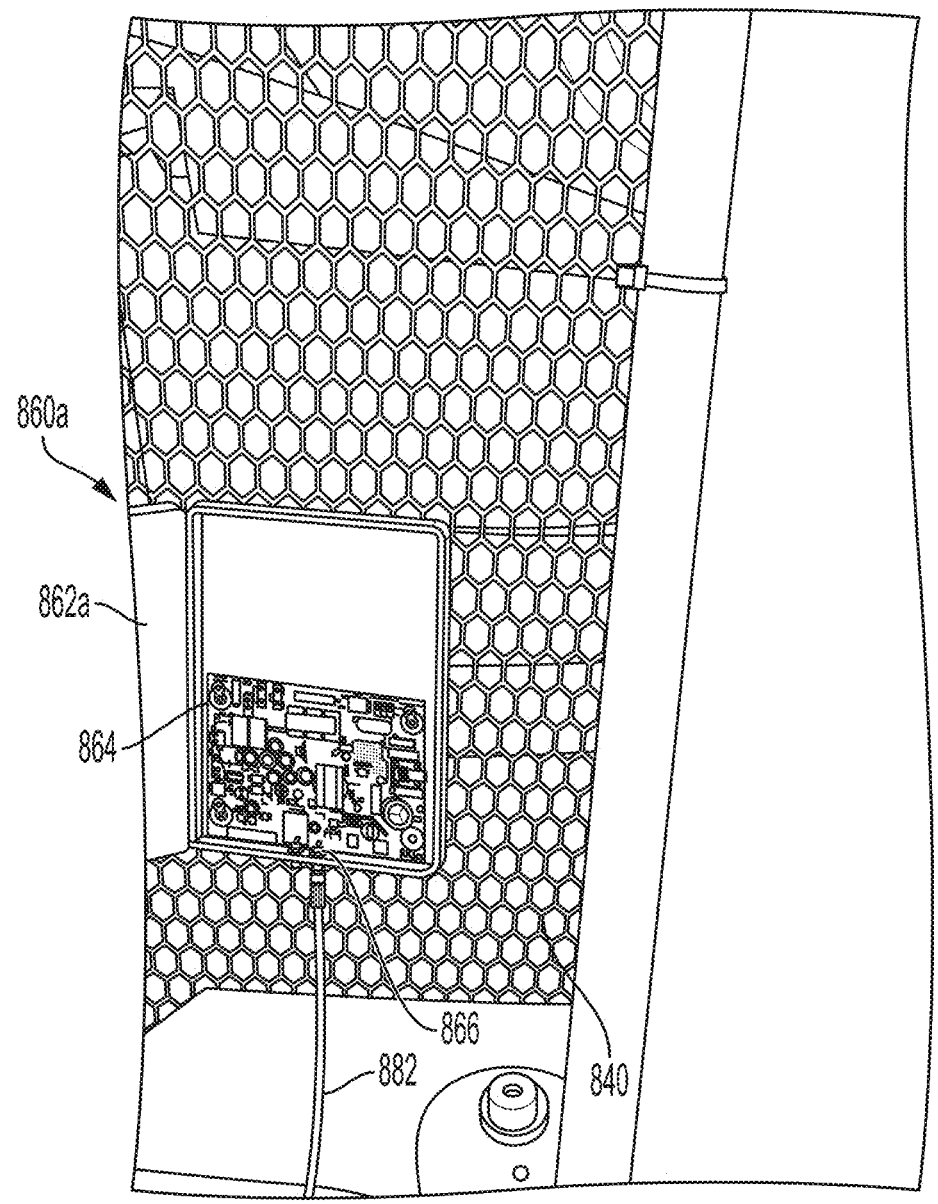
FIG. 8A is a drawing of an illustrative surge protection circuit for an MRI system configured to isolate electromagnetic noise conducted by a patient, in accordance with some embodiments of the technology described herein.

FIG. 8A is a drawing of illustrative surge protection circuit 860a for an MRI system configured to isolate electromagnetic noise conducted by a patient, in accordance with some embodiments of the technology described herein. In the illustrative embodiment of FIG. 8A, surge protection circuit 860a includes housing 862a, circuit board 864, and electrical connector 866. In some embodiments, surge protection circuit 860a may be coupled between a patient and electromagnetic shielding 840. For example, surge protection circuit 860a is shown connected between wire 882 of electrical conductor 180 and electromagnetic shielding 840. In some embodiments, surge protection circuit 860a may be connected between wire 882 and a power connection of power system 110.

In the illustrative embodiment of FIG. 8A, surge protection circuit 860a is contained in housing 862a. Housing 862a may be formed using any suitable electrically conductive material such as aluminum, such that surge protection circuit 860a may couple to electromagnetic shielding 840 through housing 862a. Alternatively, housing 862a may be formed using an electrically insulative material such as plastic. For example, surge protection circuit 860a may include an electrical connector configured to couple to a complimentary electrical connector of electromagnetic shielding 840. Although housing 862a is shown with an open door such that circuit board 864 may be seen, it should be appreciated that in some embodiments, housing 862a may not include a door. Additionally, some embodiments do not include housing 862a.

In some embodiments, surge protection circuit 860a may be configured for removably coupling to electrical conductor 180. In the illustrative embodiment of FIG. 8A, surge protection circuit 860a is coupled to wire 882 of electrical conductor 180 via electrical connector 866. Wire 882 includes a banana plug and electrical connector 866 includes a complementary banana socket configured to receive the banana plug of wire 882. In some embodiments, surge protection circuit 860a includes multiple electrical connectors 866 configured to receive electrical conductors 180. It should be appreciated that electrical connector 866 may include any suitable type of electrical connector configured for removably coupling to an electrical conductor such as a clip, and/or an attachment device such as conductive tape.

Surge protection circuit 860a is configured to protect a patient from being electrocuted through electromagnetic shielding 840 or through a ground connection in the event of an electrical surge or other overvoltage event (e.g., electrostatic discharge). For example, circuit board 864 of surge protection circuit 860a may include a high pass filter configured to isolate electrical surge energy at power transmission frequencies (e.g., 50-60 Hz) from electromagnetic shielding 840 and to couple electromagnetic noise at operational frequencies (e.g., 2.76 MHz) to electromagnetic shielding 840. The high pass filter may provide a high impedance at power transmission frequencies (e.g., approximately 1 MΩ at approximately 50-60 Hz) and a low impedance at operational frequencies (e.g., 100Ω at 2.76 MHz). The high pass filter is described herein including with reference to FIG. 9.

Figure 8B:
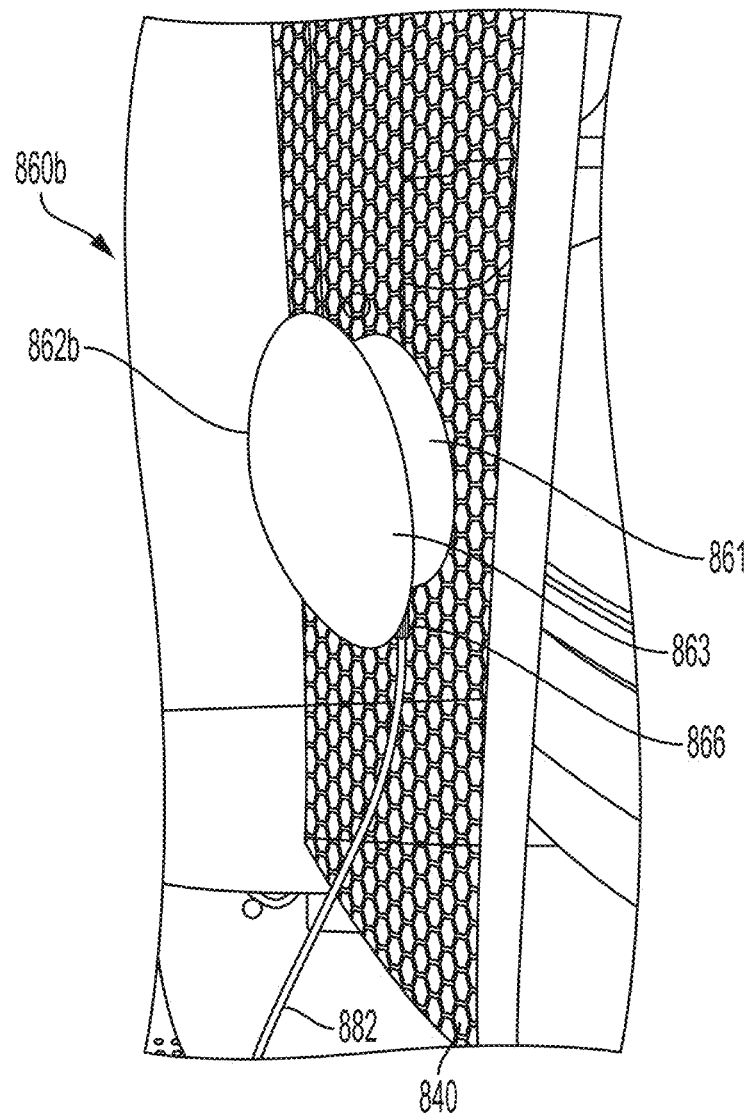
FIG. 8B is a drawing of an illustrative surge protection circuit for an MRI system configured to isolate electromagnetic noise conducted by a patient, in accordance with some embodiments of the technology described herein.

FIG. 8B is a drawing of illustrative surge protection circuit 860b for an MRI system configured to isolate electromagnetic noise conducted by a patient, in accordance with some embodiments of the technology described herein. In the illustrative embodiment of FIG. 8B, surge protection circuit 860b includes housing 862b, circuit board 864 (hidden from view) and electrical connector 866. Unlike housing 862a, housing 862b includes a cylinder terminating in a cap. Additionally, in FIG. 8B, housing 862b is shown closed, such that circuit board 864 is hidden from view. Surge protection circuit 860b is configured to protect a patient from being electrocuted by an electrical surge or other overvoltage event while coupled to electromagnetic shielding 840 and/or grounded. For example, surge protection circuit 860a may be configured for coupling between a patient and electromagnetic shielding 840 and/or to ground in the manner described in connection with FIG. 8A.

In the illustrative embodiment of FIG. 8B, surge protection circuit 860b is contained in housing 862b. Housing 862b includes cylinder 861 terminating in cap 863. In some embodiments, wire 882 may be wound around cylinder 861 and held in place by cap 863. Housing 862b may be formed using any suitable electrically conductive material such as aluminum, such that surge protection circuit 860b may couple to electromagnetic shielding 840 through housing 862b. Alternatively, housing 862b may be formed using an electrically insulative material such as plastic. For example, surge protection circuit 860b may include an electrical connector configured to couple to a complimentary electrical connector of electromagnetic shielding 840. It should be appreciated that in some embodiments, housing 862b may include a door. Additionally, some embodiments do not include housing 862b.

Aspects of housing 862b, such as cylinder 861 terminating in cap 863 allow electrical conductors coupled to one or more peripheral devices in an operating environment of the MRI system to be coupled to electromagnetic shielding 840, such that electromagnetic noise from the peripheral device(s) may be isolated from the imaging region of the MRI system. For example, peripheral device(s) connected to the patient may introduce additional electromagnetic noise at operational frequencies of the MRI system. Electrical conductors connected to the peripheral devices may be wrapped around cylinder 861 and held steady by cap 863, such that electromagnetic noise conducted by the electrical conductors may be inductively coupled to electromagnetic shielding 840. Accordingly, electromagnetic noise from the peripheral devices may be prevented from reaching the imaging region and impacting operation of the MRI system.

It should be appreciated that surge protection circuit 860b includes circuit board 864 and electrical connector 866, which may operate in the manner described in connection with FIG. 8A.

Figure 9:
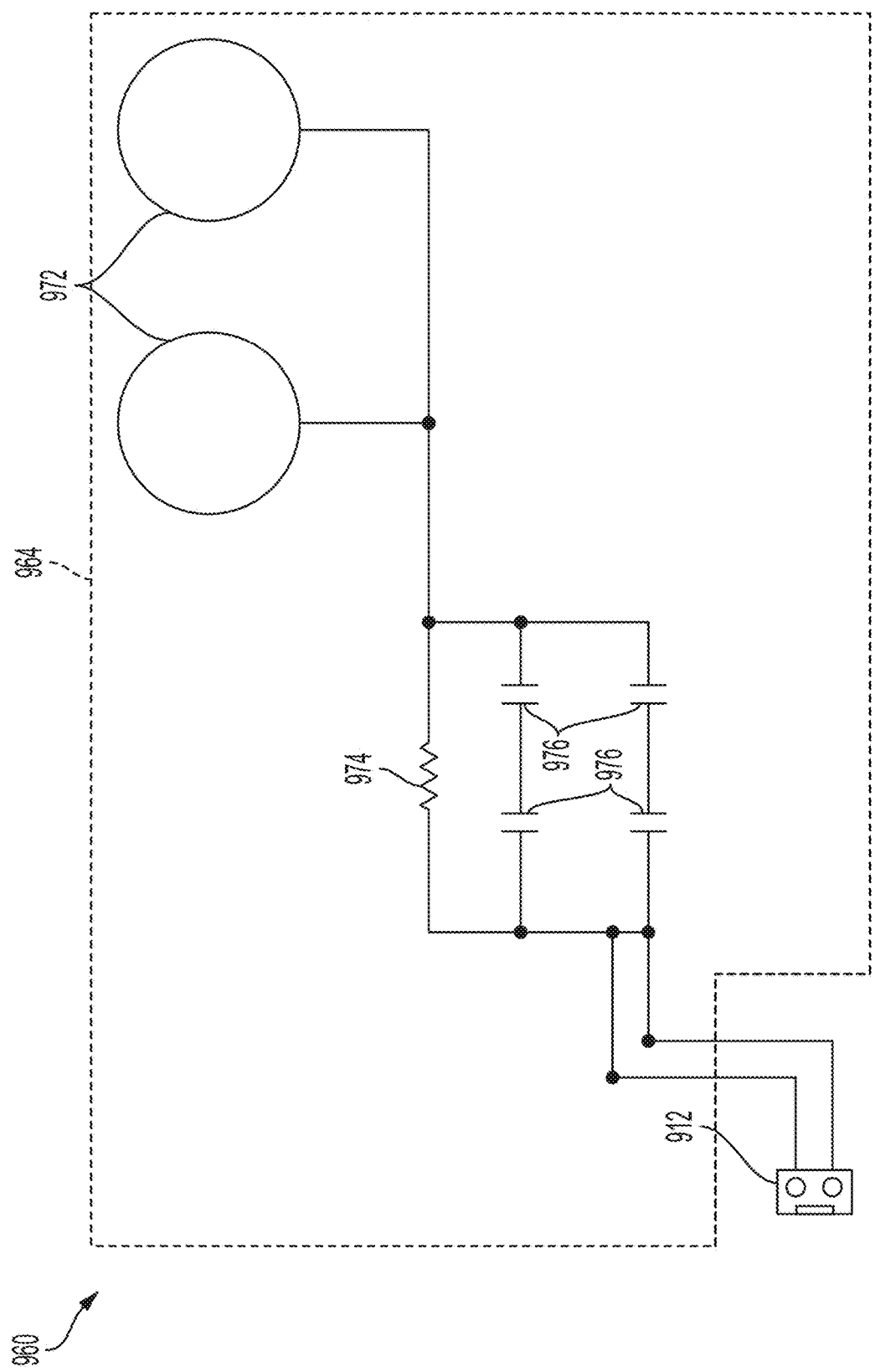
FIG. 9 is a drawing of an illustrative surge protection circuit for an MRI system configured to isolate electromagnetic noise conducted by a patient, in accordance with some embodiments of the technology described herein.

FIG. 9 is a circuit diagram of illustrative surge protection circuit 960 for an MRI system configured to isolate electromagnetic noise coupled by a patient, in accordance with some embodiments of the technology described herein. In the illustrative embodiment of FIG. 9, surge protection circuit 960 includes circuit board 964 including input nodes 972 and circuit components such as resistor 974, and capacitors 976. Additionally, circuit board 964 includes external connection 912 which may be coupled to electromagnetic shielding 140, and/or to ground through power system 110.

In some embodiments, input nodes 972 may be coupled to electrical conductor 180. For example, an electrical connector of electrical conductor 180 may couple to input nodes 972. Accordingly, surge protection circuit 960 may receive electromagnetic noise at input nodes 972 from the patient. Additionally, in the event of an electrical surge event, electrical surge energy may be received at input nodes 972.

In the illustrative embodiment of FIG. 9, circuit board 964 includes a high pass filter configured to couple electromagnetic noise received at input nodes 972 to external connection 912, and to isolate electrical surge energy received at input nodes 972 from external connection 912. The high pass filter may be configured to isolate electrical energy below a cutoff frequency and to couple electrical energy above the cutoff frequency to external connection 912. For example, resistor 974 and capacitors 976 include a parallel resistor-capacitor (RC) circuit which determine the cutoff frequency of the high pass filter. Below the cutoff frequency, an impedance of the RC circuit is large enough to isolate electrical energy. Above the cutoff frequency, the impedance of the RC circuit is small enough to no longer isolate electrical energy. In some embodiments, the high pass filter is configured to provide a high impedance (e.g., approximately 2.6 MΩ) at power transmission frequencies (e.g., approximately 50-60 Hz) and a low impedance (e.g., 100Ω) at operational frequencies (e.g., 2.76 MHz). Accordingly, electrical surge energy at power transmission frequencies may be isolated from external connection 912, and electromagnetic noise at frequencies of operation may be coupled to external connection 912.

It should be appreciated that the high pass filter may be configured to provide other desired impedances than what is specified above. In some embodiments, the high pass filter may be configured to provide an impedance between 1 MΩ and 5 MΩ, between 5 MΩ and 10 MΩ, between 10 MΩ and 20 MΩ, or any other suitable high impedance at power transmission frequencies. In some embodiments, the high pass filter may be configured to provide an impedance between 25Ω and 75Ω, between 501 and 100Ω, between 100Ω and 250Ω, or any other suitable low impedance at operational frequencies.

Surge protection circuit 960a is configured to couple electromagnetic noise received at input nodes 972 to external connection 912. In the illustrative embodiment of FIG. 9, the high pass filter may be coupled to electromagnetic shielding 140 and/or to ground through power system 110 at external connection 912. For example, the high pass filter may be coupled to ground at a power connection of power system 110.

Figure 10:
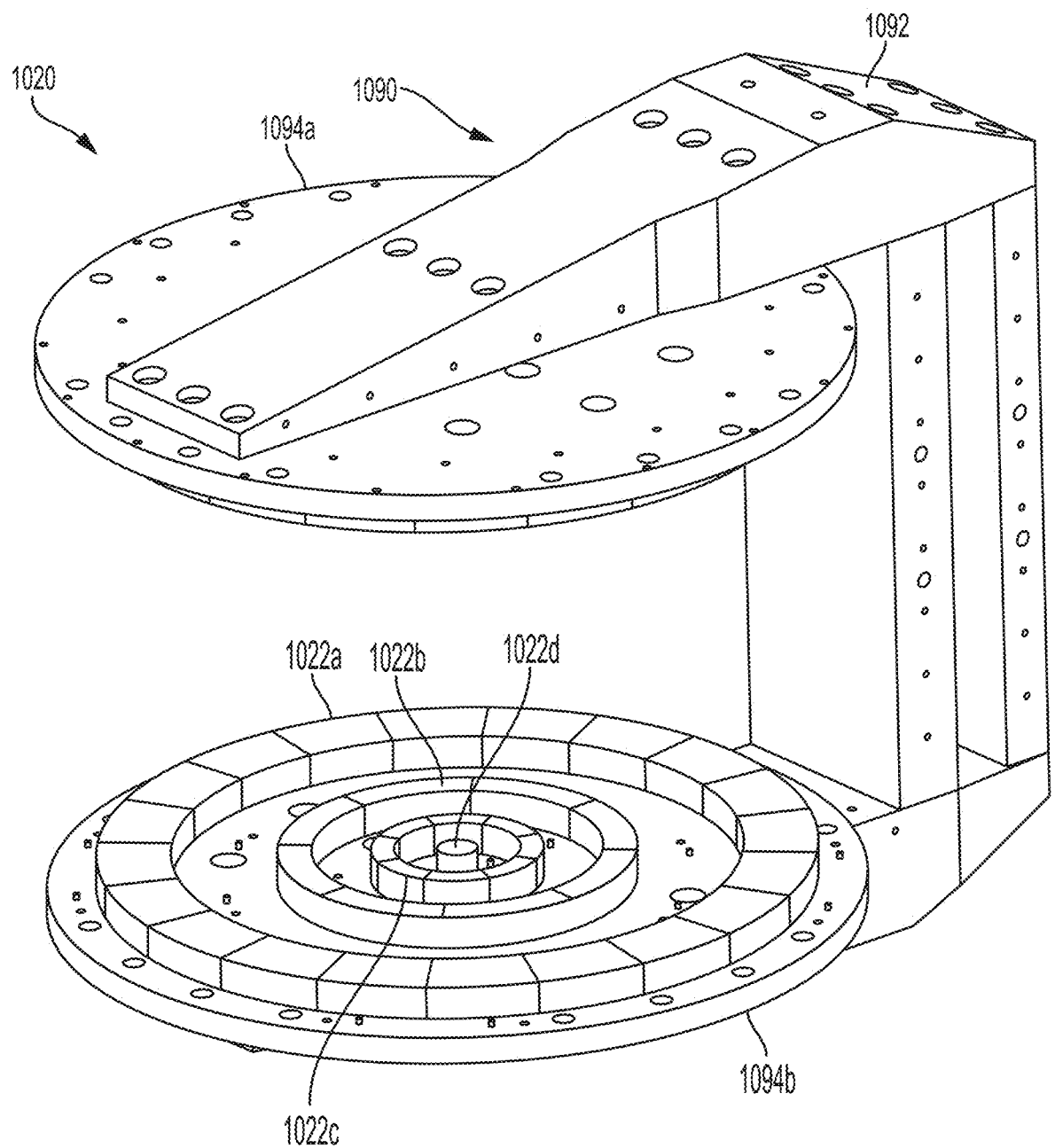
FIG. 10 is a drawing of an illustrative $B_0$ magnet for an MRI system configured to isolate electromagnetic noise conducted by a patient, in accordance with some embodiments of the technology described herein.

FIG. 10 illustrates permanent $B_0$ magnet 1020, in accordance with some embodiments of the technology described herein. In particular, $B_0$ magnet 1020 is formed by permanent magnets arranged in a bi-planar geometry and yoke 1090 that captures electromagnetic flux produced by the permanent magnets and transfers the flux to the opposing permanent magnet to increase the flux density between the permanent magnets. Each of the permanent magnets are formed from a plurality of concentric permanent magnets. In particular, as visible in FIG. 10, each permanent magnetic comprises an outer ring of permanent magnets 1022a, a middle ring of permanent magnets 1022b, an inner ring of permanent magnets 1022c, and a permanent magnet disk 1022d at the center. Each permanent magnet may comprise the same set of permanent magnet elements as the illustrated bottom permanent magnet.

The permanent magnet material used may be selected depending on the design requirements of the system. For example, according to some embodiments, the permanent magnets (or some portion thereof) may be made of NdFeB, which produces a magnetic field with a relatively high magnetic field per unit volume of material once magnetized. According to some embodiments, SmCo material is used to form the permanent magnets, or some portion thereof. While NdFeB produces higher field strengths (and in general is less expensive than SmCo), SmCo exhibits less thermal drift and thus provides a more stable magnetic field in the face of temperature fluctuations. Other types of permanent magnet material(s) may be used as well, as the aspects are not limited in this respect. In general, the type or types of permanent magnet material utilized will depend, at least in part, on the field strength, temperature stability, weight, cost and/or ease of use requirements of a given $B_0$ magnet implementation.

The permanent magnet rings are sized and arranged to produce a homogenous field of a desired strength in the central region (field of view) between the permanent magnets. In the exemplary embodiment illustrated in FIG. 10, each permanent magnet ring comprises a plurality of segments, each segment formed using a plurality of blocks that are stacked in the radial direction and positioned adjacent to one another about the periphery to form the respective ring. The inventors have appreciated that by varying the width (in the direction tangent to the ring) of each permanent magnet, less waste of useful space may be achieved while using less material. For example, the space between stacks that does not produce useful magnetic fields can be reduced by varying the width of the blocks, for example, as function of the radial position of the block, allowing for a closer fit to reduce wasted space and maximize the amount of magnetic field that can be generated in a given space. The dimensions of the blocks may also be varied in any desired way to facilitate the production of a magnetic field of desired strength and homogeneity, as described in further detail below.

$B_0$ magnet 1020 further comprises yoke 1090 configured and arranged to capture magnetic flux generated by the permanent magnets and direct it to the opposing side of the $B_0$ magnet to increase the flux density in between the permanent magnets, increasing the field strength within the field of view of the $B_0$ magnet. By capturing magnetic flux and directing it to the region between the permanent magnets, less permanent magnet material can be used to achieve a desired field strength, thus reducing the size, weight and cost of the $B_0$ magnet. Alternatively or additionally, for given permanent magnets, the field strength can be increased, thus improving the SNR of the system without having to use increased amounts of permanent magnet material. For exemplary $B_0$ magnet 1020, yoke 1090 comprises a frame 1092 and plates 1094*a* and 1094*b*. Plates 1094*a* and 1094*b* capture magnetic flux generated by the permanent magnets and direct it to frame 1090 to be circulated via the magnetic return path of the yoke to increase the flux density in the field of view of the $B_0$ magnet. Yoke 1090 may be constructed of any desired ferromagnetic material, for example, low carbon steel, CoFe and/or silicon steel, etc. to provide the desired magnetic properties for the yoke. According to some embodiments, plates 1094*a* and 1094*b* (and/or frame 1092 or portions thereof) may be constructed of silicon steel or the like in areas where the gradient coils could most prevalently induce eddy currents.

Exemplary frame 1092 comprises arms that attach to plates 1094*a* and 1094*b*, respectively, and supports providing the magnetic return path for the flux generated by the permanent magnets. The arms are generally designed to reduce the amount of material needed to support the permanent magnets while providing sufficient cross-section for the return path for the magnetic flux generated by the permanent magnets. Each arms has two supports within a magnetic return path for the $B_0$ field produced by the $B_0$ magnet. The supports are produced with a gap formed between, providing a measure of stability to the frame and/or lightness to the structure while providing sufficient cross-section for the magnetic flux generated by the permanent magnets. For example, the cross-section needed for the return path of the magnetic flux can be divided between the two support structures, thus providing a sufficient return path while increasing the structural integrity of the frame. It should be appreciated that additional supports may be added to the structure, as the technique is not limited for use with only two supports and any particular number of multiple support structures.

As described above, the exemplary permanent magnets comprise a plurality of rings of permanent magnetic material concentrically arranged with a permanent magnet disk at the center. Each ring may comprise a plurality of stacks of ferromagnetic material to form the respective ring, and each stack may include one or more blocks, which may have any number (including a single block in some embodiments and/or in some of the rings). The blocks forming each ring may be dimensioned and arranged to produce a desired magnetic field. The inventors have recognized that the blocks may be dimensioned in a number of ways to decrease cost, reduce weight and/or improve the homogeneity of the magnetic field produced, in accordance with some embodiments. Further aspects of $B_0$ magnets such as $B_0$ magnet 1020 are described in U.S. Pat. Application No. 2018/0164390, titled "Electromagnetic Shielding For Magnetic Resonance Imaging Methods and Apparatus", which is herein incorporated by reference in its entirety.

Figure 11:
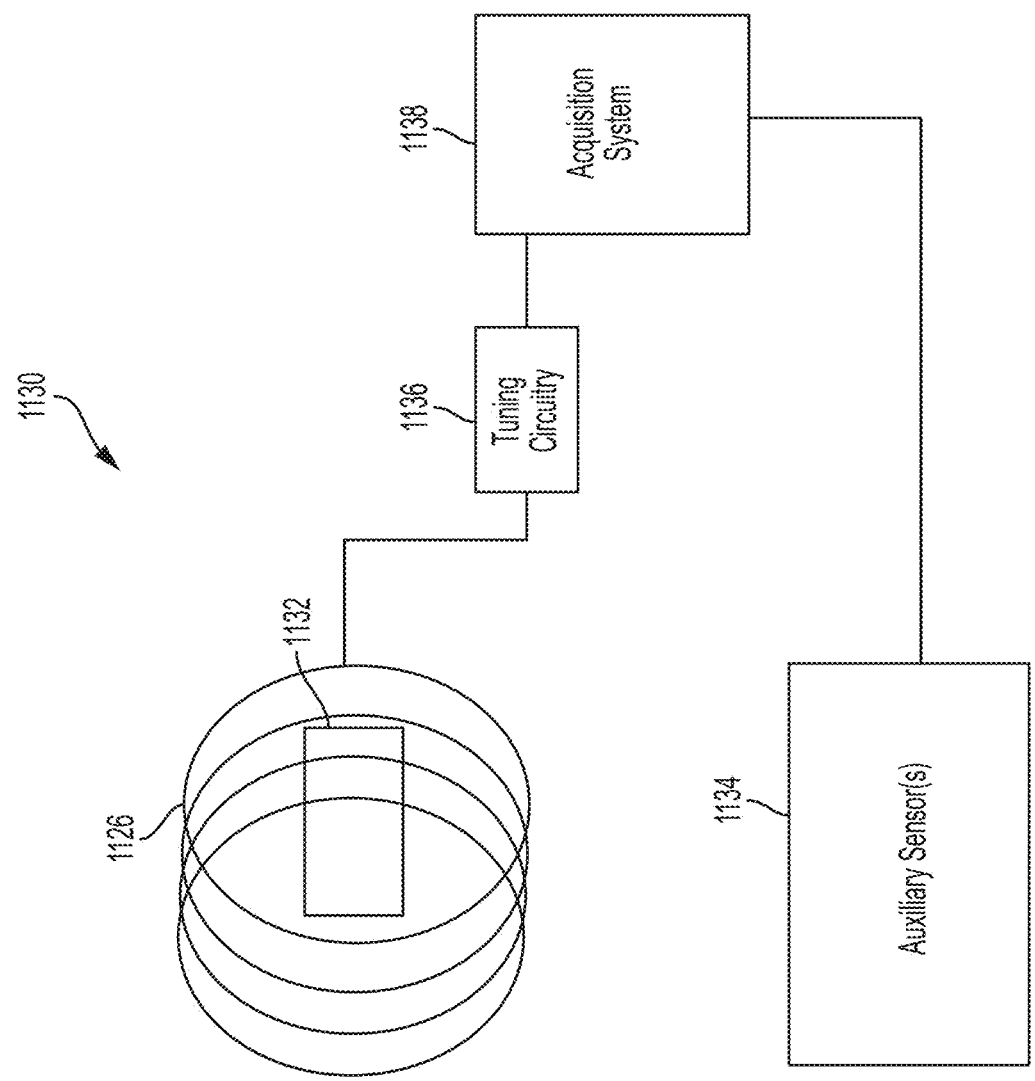
FIG. 11 is a drawing of an illustrative noise reduction system for an MRI system configured to isolate electromagnetic noise conducted by a patient, in accordance with some embodiments of the technology described herein.

FIG. 11 is a drawing of illustrative noise reduction system 1130 for an MRI system configured to isolate electromagnetic noise conducted by a patient, in accordance with some embodiments of the technology described herein. In the illustrative embodiment of FIG. 11, noise reduction system 1130 is configured to detect MR signals emitted from excited atoms of a subject 1132 being imaged, and to characterize noise in the environment to suppress or remove the characterized noise from the detected MR signals, as described in further detail below.

In the illustrative embodiment of FIG. 11, noise reduction system 1130 includes primary RF receive coil 1126 configured to measure MR signals emitted by subject 1132 in response to an excitation pulse sequence (e.g., a pulse sequence selected from pulse sequence repository 108 and executed by controller 106). The excitation pulse sequence may be produced by primary RF receive coil 1126 and/or by one or more other transmit RF coils arranged proximate subject 1132 and configured to produce suitable MR pulse sequences when operated. Primary receive coil 1126 may be a single coil or may be a plurality of coils, which, in the latter case, may be used to perform parallel MRI. Tuning circuitry 1136 facilitates operation of primary receive coil 1126 and signals detected by RF coil(s) 1126 are provided to acquisition system 1138, which may amplify the detected signals, digitize the detected signals, and/or perform any other suitable type of processing.

Noise reduction system 1130 also includes auxiliary sensor(s) 1134, which may include any number or type of sensor(s) configured to detect or otherwise measure noise sources in the environment and/or environmental noise produced by the MRI system itself. The noise measured by auxiliary sensor(s) 1134 may be characterized and used to suppress noise in the MR signal detected by primary RF coil(s) 1126 using techniques described in further detail below. After acquisition system 1138 processes the signals detected by RF coil(s) 1126 and auxiliary sensor(s) 1134, acquisition system 1138 may provide the processed signals to one or more other components of the MRI system for further processing (e.g., for use in forming one or more MR images of subject 1132). Acquisition system 1138 may include any suitable circuitry and may include, for example, one or more controllers and/or processors configured to control the MRI system to perform noise suppression.

The inventors have appreciated that by coupling one or more auxiliary sensors to one or more EMI shields (e.g., a Faraday cage of one or more components or the like) of the system, the noise absorbed by the one or more EMI shields can be measured, characterized and used to suppress and/or eliminate noise from detected MR signals. According to some embodiments, the auxiliary sensor(s) include one or more sensors coupled between the patient and electromagnetic shielding 140 and/or ground to measure noise captured by the patient from the surrounding environment that can be used to facilitate noise suppression. For example, the noise detected from electrical conductor 180, electromagnetic shielding 140 and/or surge protection circuit 160 may be used to compute, at least in part, a transform that can be utilized in suppressing and/or eliminating noise from detected MR signals. Accordingly, one or more auxiliary sensors may be coupled to or between each of electrical conductor 180, electromagnetic shielding 140 (including shielding portion 724) and surge protection circuit 160. It should be appreciated that the auxiliary sensor(s) may include any other type of sensor capable of detecting noise, as the aspects are not limited in this respect.

In some embodiments, auxiliary sensor(s) 1134 may include one or more auxiliary coils configured to measure noise from one or more noise sources in the environment in which the MRI system is operating. In some instances, the auxiliary RF coil(s) may be constructed to be substantially more sensitive to ambient noise than to any noise generated by the coil itself. For example, the auxiliary RF coil may have a sufficiently large aperture and/or a number of turns such that the auxiliary coil is more sensitive to noise from the environment than to noise generated by the auxiliary coil itself. In some embodiments, auxiliary RF coil(s) may have a larger aperture and/or a greater number of turns than primary RF coil(s) 1126. However, auxiliary RF coil(s) may be the same as primary RF coil in this respect and/or may differ from primary RF coil(s) 1126 in other respects, as the techniques described herein are not limited to any particular choice of coils. For example, in some embodiments, an auxiliary sensor of a different type is used in place of an RF coil type sensor. Further aspects of noise reduction systems, such as noise reduction system 1130, are described in U.S. Pat. No. 9,797,971, titled "Noise Suppression Methods and Apparatus", which is herein incorporated by reference in its entirety.

Figure 12:
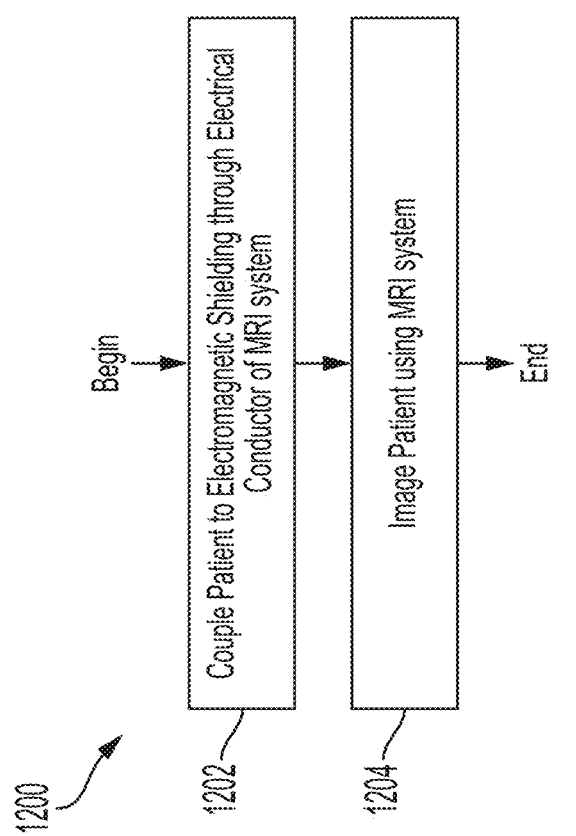
FIG. 12 is a drawing of an illustrative method for operating an MRI system configured to isolate electromagnetic noise conducted by a patient, in accordance with some embodiments of the technology described herein.

FIG. 12 is a drawing of illustrative method 1200 for operating an MRI system configured to isolate electromagnetic noise conducted by a patient, in accordance with some embodiments of the technology described herein. Method 1200 includes coupling the patient to electromagnetic shielding 140 through electrical conductor 180 of the MRI system at step 1202, and imaging the patient using the MRI system at step 1204. In some embodiments, method 1200 may be performed by using any of the MRI systems described herein and one or more operators (e.g., user 102 which may include a technician, nurse, clinician, or any other suitable operator) of the MRI system. The operator(s) may couple the patient to electromagnetic shielding 140 before imaging the patient or performing any other operation with the MRI system. Alternatively, some imaging or other operation of the MRI system (e.g., initialization, noise detection by the reduction system or any other suitable operation) may be performed prior to coupling the patient to electromagnetic shielding 140.

In some embodiments, coupling the patient to electromagnetic shielding 140 through electrical conductor 180 at step 1202 may include the operator(s) of the MRI system attaching electrical conductor 180 to the patient or placing electrical conductor 180 within a capacitive coupling range of the patient. For example, the operator(s) may adhere one or more wires, coupled to electromagnetic shielding 140, to the patient. In some instances, the operator(s) may adhere one or more electrodes or strips of conductive tape to the patient, and clip the wire(s) (or connect any other suitable electrical connector) to the electrode(s) or strip(s). Alternatively or additionally, the operator(s) may position the patient in physical contact with a conductive portion of an electrically conductive sheet or pad, or may place the patient close enough to the electrically conductive sheet or pad that noise captured by the patient is capacitively coupled through to electromagnetic shielding 140. The electrically conductive sheet or pad may be wired or otherwise coupled to electromagnetic shielding 140.

The capacitive coupling range described herein refers to a range at which electrical energy may be coupled efficiently among two or more conductive objects. In general, capacitive coupling depends on multiple factors. Typically, two or more electrically conductive objects (e.g., plates, sheets or any other suitable object) capacitively couple electrical energy to and from one another at a range of frequencies dependent on the capacitance among the conductive objects. The capacitance is determined based on a surface area of each object, a dielectric constant of the material(s) separating the objects, and the spacing among the objects. Larger surface areas of the objects, materials having a higher dielectric constant separating the objects, and closer spacing among the objects may increase the capacitance. Given a capacitance, electrical energy may be capacitively coupled efficiently due to very little impedance at a certain frequency range and electrical energy may not be capacitively coupled efficiently due to large impedance at another frequency range. For example, a capacitance of 1 nF between two objects may result in a low impedance (e.g., approximately 60Ω) at 2.6 MHz, and a high impedance (e.g. approximately 2.6 MΩ) at 60 Hz. Efficient capacitive coupling as described herein may occur for a particular capacitance at a frequency range in which the impedance is below 250Ω.

It should be appreciated that coupling the patient to electromagnetic shielding 140 through electrical conductor 180 at step 1202 may include grounding the patient, either directly a power connection of power system 110 or indirectly, for example through electromagnetic shielding 140, surge protection circuit 160 or in any other suitable way.

In some embodiments, coupling electrical conductor 180 between the patient and electromagnetic shielding 140 includes coupling the patient to surge protection circuit 160 which is coupled to electromagnetic shielding 140. For example, surge protection circuit 160 may be mounted and connected to an outer surface of shielding 140. The operator(s) may plug an electrical connector at the end of a wire adhered to the patient, or connected to the electrically conductive sheet or pad, into a complementary connector on surge protection circuit 160.

In some embodiments, coupling the patient to electromagnetic shielding 140 through electrical conductor 180 at step 1202 may include coupling the patient to electromagnetic shielding 140 through electrically conductive sheet 680. In some embodiments, coupling the patient to electromagnetic shielding 140 through electrically conductive sheet 680 may include the operator(s) positioning the patient on, below or otherwise adjacent electrically conductive sheet 680 so as to make physical contact or to be within capacitive coupling range of electrically conductive sheet 680.

In some embodiments, coupling the patient to electromagnetic shielding 140 through electrical conductor 180 at step 1202 may include coupling the patient to electromagnetic shielding 140 through electrically conductive pad 780. In some embodiments, coupling the patient to electromagnetic shielding 140 through electrically conductive pad 780 may include the operator(s) positioning the patient on, below or otherwise adjacent electrically conductive pad 780 so as to make physical contact or to be within capacitive coupling range of electrically conductive layer(s) of electrically conductive pad 780.

At step 1204, the patient is imaged using the MRI system. For example, the operator(s) may position a portion of the patient's anatomy in the imaging region of the MRI system, and operate the MRI system to image the patient. In some embodiments, imaging the patient using the MRI system at step 1204 may include generating a magnetic resonance image of the patient's anatomy at least in part by generating magnetic fields in accordance with a pulse sequence and detecting, using at least one radio frequency coil, magnetic resonance signals emitted from the portion of the patient's anatomy. For example, the operator(s) may operate the MRI system (e.g., using computing device 104) to image the patient. Controller 106 may be configured to control power system 110 to operate the magnetic components 120 (e.g., the $B_0$ magnet, shim coils, gradient coils and radio frequency coils) in accordance with various pulse sequences. Accordingly, magnetic fields and magnetic resonance signals may be generated and/or transmitted by $B_0$ magnet 122, shim coil(s) 124, RF transmit and/or receive coil(s) 126 and gradient coil(s) 128 for imaging the patient.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as a controller that controls the above-described function. A controller can be implemented in numerous ways, such as with dedicated hardware, or with general purpose hardware (e.g., one or more processor) that is programmed using microcode or software to perform the functions recited above, and may be implemented in a combination of ways when the controller corresponds to multiple components of a system.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

The terms "approximately", "substantially", and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A magnetic resonance (MR) imaging system, comprising:
a magnetics system having a plurality of magnetics components configured to produce magnetic fields for performing magnetic resonance imaging, the magnetic fields comprising a $B_0$ magnetic field having a field strength between 50 mT and 0.2 T, wherein the magnetics system comprises a plurality of gradient coils configured to, when operated, generate magnetic fields to provide spatial encoding of emitted magnetic resonance signals;
a grounded electrical conductor configured to ground a patient during imaging of the patient by the MR imaging system; and
electromagnetic shielding,
wherein:
the electromagnetic shielding is grounded;
the grounded electrical conductor is grounded through the electromagnetic shielding; and
a first portion of the electromagnetic shielding is positioned between the plurality of gradient coils and an imaging region of the magnetic resonance imaging system.

2. The MR imaging system of claim 1, wherein the magnetics system further comprises:
at least one permanent $B_0$ magnet to produce a magnetic field to contribute to the $B_0$ magnetic field for the MR imaging system
and
at least one radio frequency coil configured to, when operated, transmit radio frequency signals to a field of view of the MR imaging system and to receive magnetic resonance signals emitted from the field of view.

3. The MR imaging system of claim 1, wherein the first portion of the electromagnetic shielding comprises a frequency selective mesh.

4. The MR imaging system of claim 3, wherein the frequency selective mesh is configured to pass substantially all electromagnetic signals having a frequency between 1 KHz and 10 KHz and reflect back substantially all electromagnetic signals having a frequency at or above 2.76 MHz.

5. The MR imaging system of claim 4, wherein the frequency selective mesh comprises a copper mesh having a density between 50 and 150 lines per inch.

6. A magnetic resonance (MR) imaging system, comprising:
a magnetics system having a plurality of magnetics components configured to produce magnetic fields for performing magnetic resonance imaging, the magnetic fields comprising a $B_0$ magnetic field having a field strength between 50 mT and 0.2 T;
a grounded electrical conductor configured to ground a patient during imaging of the patient by the MR imaging system; and
electromagnetic shielding,
wherein:
the electromagnetic shielding is grounded;
the grounded electrical conductor is grounded through the electromagnetic shielding; and
the electromagnetic shielding is grounded through a power connection of the MR imaging system.

7. The MR imaging system of claim 6, wherein the grounded electrical conductor comprises an electrically conductive sheet.

8. The MR imaging system of claim 7, further comprising a surface for supporting the patient during imaging, wherein at least a part of the electrically conductive sheet is disposed on the surface.

9. The MR imaging system of claim 8, further comprising an electrically insulative layer disposed on at least a part of the electrically conductive sheet.

10. The MR imaging system of claim 6, wherein the grounded electrical conductor comprises an electrically conductive pad.

11. The MR imaging system of claim 10, further comprising electromagnetic shielding, and wherein:
the magnetics system comprises a plurality of gradient coils configured to, when operated, generate magnetic fields to provide spatial encoding of emitted magnetic resonance signals;
the electromagnetic shielding comprises a first portion positioned between the plurality of gradient coils and the electrically conductive pad; and
the electrically conductive pad is grounded through the electromagnetic shielding.

12. The MR imaging system of claim 6, wherein the grounded electrical conductor comprises a first wire coupled to a first electrical connector configured to be attached to a patient.

13. The MR imaging system of claim 12, wherein the first electrical connector comprises a clip.

14. The MR imaging system of claim 13, further comprising a second wire coupled to a second electrical connector configured to be attached to a patient.

15. The MR imaging system of claim 12, wherein the grounded electrical conductor further comprises a second electrical connector configured to be removably attached to a complementary socket.

16. The MR imaging system of claim 6, wherein the magnetics system comprises:
at least one permanent $B_0$ magnet to produce a magnetic field to contribute to the $B_0$ magnetic field for the MR imaging system
a plurality of gradient coils configured to, when operated, generate magnetic fields to provide spatial encoding of emitted magnetic resonance signals; and
at least one radio frequency coil configured to, when operated, transmit radio frequency signals to a field of view of the MR imaging system and to receive magnetic resonance signals emitted from the field of view.

17. A method of operating a magnetic resonance imaging (MRI) system, the MRI system comprising a magnetics system having a plurality of magnetics components configured to produce magnetic fields for performing MRI and an electrical conductor, the method comprising:
grounding a patient through the electrical conductor, wherein grounding the patient through the electrical conductor comprises coupling the electrical conductor between the patient and electromagnetic shielding of the MRI system, and wherein coupling the electrical conductor between the patient and the electromagnetic shielding comprises coupling the patient to a surge protection circuit coupled to the electromagnetic shielding; and
imaging the patient using a $B_0$ magnetic field generated by components of the MRI system, the $B_0$ magnetic field having a field strength between 50 mT and 0.2 T.

18. The method of claim 17, wherein grounding the patient through the electrical conductor comprises coupling the patient to ground through an electrically conductive sheet.

* * * * *

UNITED STATES PATENT AND TRADEMARK OFFICE
CERTIFICATE OF CORRECTION

PATENT NO. : 11,061,089 B2  Page 1 of 1
APPLICATION NO. : 16/680992
DATED : July 13, 2021
INVENTOR(S) : Boskamp et al.

It is certified that error appears in the above-identified patent and that said Letters Patent is hereby corrected as shown below:

On the Title Page

Item [71], should read:
Hyperfine, Inc., Guilford, CT (US)

Signed and Sealed this
Nineteenth Day of October, 2021

Drew Hirshfeld
*Performing the Functions and Duties of the*
*Under Secretary of Commerce for Intellectual Property and*
*Director of the United States Patent and Trademark Office*